US012767819B2

(12) United States Patent
Kikuchi et al.

(10) Patent No.: US 12,767,819 B2
(45) Date of Patent: Oct. 20, 2026

(54) RESIN COMPOSITION, MOLDED ARTICLE, AND METHOD FOR MANUFACTURING PLATED MOLDED ARTICLE

(71) Applicant: MITSUBISHI ENGINEERING-PLASTICS CORPORATION, Tokyo (JP)

(72) Inventors: Tatsuya Kikuchi, Hiratsuka (JP); Rina Takeuchi, Hiratsuka (JP); Yohei Nishino, Hiratsuka (JP)

(73) Assignee: MITSUBISHI ENGINEERING-PLASTICS CORPORATION, Tokyo (JP)

( * ) Notice: Subject to any disclaimer, the term of this patent is extended or adjusted under 35 U.S.C. 154(b) by 718 days.

(21) Appl. No.: 17/913,601

(22) PCT Filed: Jul. 16, 2021

(86) PCT No.: PCT/JP2021/026765
§ 371 (c)(1),
(2) Date: Sep. 22, 2022

(87) PCT Pub. No.: WO2022/024808
PCT Pub. Date: Feb. 3, 2022

(65) Prior Publication Data

US 2023/0374300 A1 Nov. 23, 2023

(30) Foreign Application Priority Data

Jul. 28, 2020 (JP) ................................ 2020-127018
Jan. 12, 2021 (JP) ................................ 2021-002971

(51) Int. Cl.

*C08L 69/00* (2006.01)
*C08K 3/22* (2006.01)
*C08K 5/00* (2006.01)
*C08K 7/14* (2006.01)
*C08L 67/00* (2006.01)
*C08L 67/03* (2006.01)
*C23C 18/16* (2006.01)
*C23C 18/31* (2006.01)
*H05K 1/03* (2006.01)
*C08L 51/06* (2006.01)

(52) U.S. Cl.

CPC ................ *C08L 69/00* (2013.01); *C08K 3/22* (2013.01); *C08K 5/0066* (2013.01); *C08K 7/14* (2013.01); *C08L 67/03* (2013.01); *C23C 18/1612* (2013.01); *C23C 18/1641* (2013.01); *C23C 18/31* (2013.01); *H05K 1/0373* (2013.01); *C08K 2003/2227* (2013.01); *C08K 2003/2231* (2013.01); *C08K 3/2279* (2013.01); *C08K 2003/2296* (2013.01); *C08K 2201/001* (2013.01); *C08L 51/06* (2013.01); *C08L 2201/02* (2013.01); *C08L 2203/20* (2013.01); *H05K 1/0366* (2013.01); *H05K 2203/107* (2013.01)

(58) Field of Classification Search
None
See application file for complete search history.

(56) References Cited

U.S. PATENT DOCUMENTS

| | | | | |
|---|---|---|---|---|
| 6,485,558 | B1 * | 11/2002 | Metz | C09B 67/0013 106/497 |
| 6,860,241 | B2 * | 3/2005 | Martin | B01D 27/00 428/407 |
| 10,047,520 | B2 | 8/2018 | Morcrette | |
| 2009/0292051 | A1 | 11/2009 | Li et al. | |
| 2014/0162070 | A1 | 6/2014 | Motegi et al. | |
| 2015/0175803 | A1 | 6/2015 | Stoppelmann | |
| 2015/0175804 | A1 | 6/2015 | Aepli | |
| 2015/0210849 | A1 * | 7/2015 | Motegi | C23C 18/1868 428/300.1 |
| 2016/0108234 | A1 | 4/2016 | Kikuchi et al. | |
| 2016/0160044 | A1 * | 6/2016 | Kanaya | C08L 69/00 524/502 |
| 2017/0022358 | A1 | 1/2017 | Schrauwen | |
| 2017/0355816 | A1 * | 12/2017 | Wehrmann | C08L 23/30 |
| 2018/0134894 | A1 | 5/2018 | Motegi et al. | |
| 2018/0267196 | A1 | 9/2018 | Ellis et al. | |
| 2020/0224028 | A1 | 7/2020 | Yamada et al. | |
| 2023/0374300 | A1 | 11/2023 | Kikuchi et al. | |

FOREIGN PATENT DOCUMENTS

| | | |
|---|---|---|
| CN | 106883580 A | 6/2017 |
| CN | 110157173 A | 8/2019 |

(Continued)

OTHER PUBLICATIONS

International Search Report and Written Opinion of the International Searching Authority (Forms PCT/ISA/220, PCT/ISA/210, and PCT/ISA/237) for International Application No. PCT/JP2021/026765, dated Aug. 24, 2021.

Chinese Office Action for Chinese Application No. 202180058963.5, dated Oct. 20, 2024, with English translation.

(Continued)

*Primary Examiner* — David J Buttner
(74) *Attorney, Agent, or Firm* — Birch, Stewart, Kolasch & Birch, LLP

(57) ABSTRACT

To provide a resin composition having high relative permittivity, while keeping low loss tangent, and excellent mechanical strength; a molded article; and a method for manufacturing a plated molded article. A resin composition comprising: per 100 parts by mass of a thermoplastic resin, 0.3 to 10 parts by mass an acid-modified polymer; 5 to 150 parts by mass of a laser direct structuring additive; and 10 to 150 parts by mass of a reinforcing fiber, the laser direct structuring additive being a compound being a conductive oxide having a resistivity of $5\times10^3$ Ω·cm or smaller, and containing at least one type selected from a Group n (n represents an integer of 3 to 16) metal in the periodic table and a Group n+1 metal, or, calcium copper titanate.

3 Claims, 1 Drawing Sheet

(56) References Cited

FOREIGN PATENT DOCUMENTS

| | | | |
|---|---|---|---|
| CN | 110655792 A | | 1/2020 |
| EP | 2 998 361 A1 | | 3/2016 |
| JP | 2014-240454 A | | 12/2014 |
| JP | 2015-71739 A | | 4/2015 |
| JP | 2015-101596 A | | 6/2015 |
| JP | 2015-120908 A | | 7/2015 |
| JP | 2017-500418 A | | 1/2017 |
| JP | 2017-512882 A | | 5/2017 |
| JP | 2020-515659 A | | 5/2020 |
| KR | 10-2014-0029130 A | | 3/2014 |
| KR | 10-2016-0005787 A | | 1/2016 |
| WO | WO2009/024496 A2 | | 2/2009 |
| WO | WO2015/033955 A1 | | 3/2015 |
| WO | WO2015/155376 A1 | | 10/2015 |
| WO | 2017-528530 A | | 9/2017 |
| WO | WO 2018/178128 A1 | | 10/2018 |
| WO | WO 2019/069805 A1 | | 4/2019 |
| WO | WO 2020/126188 A1 | | 6/2020 |
| WO | WO2020/129472 | * | 6/2020 |

OTHER PUBLICATIONS

Extended European Search Report for European Application No. 20188039.0, dated Oct. 26, 2020.

International Search Report (Form PCT/ISA/210) for International Application No. PCT/EP2021/069929, dated Sep. 30, 2021.

Japanese Office Action for Japanese Application No. 2023-505829, dated Apr. 8, 2025, with English translation.

Written Opinion of the International Searching Authority (Form PCT/ISA/237) for International Application No. PCT/EP2021/069929, dated Sep. 30, 2021.

Extended European Search Report for corresponding European Application No. 21850371.2, dated Jun. 19, 2024.

U.S. Office Action for U.S. Appl. No. 18/016,992, dated Oct. 8, 2025.

U.S. Office Action for U.S. Appl. No. 18/016,992, dated Jan. 12, 2026.

U.S. Office Action for U.S. Appl. No. 18/016,992, dated Jun. 4, 2026.

Korean Office Action for corresponding Korean Application No. 10-2022-7039646, dated Jun. 5, 2026, with English translation.

* cited by examiner

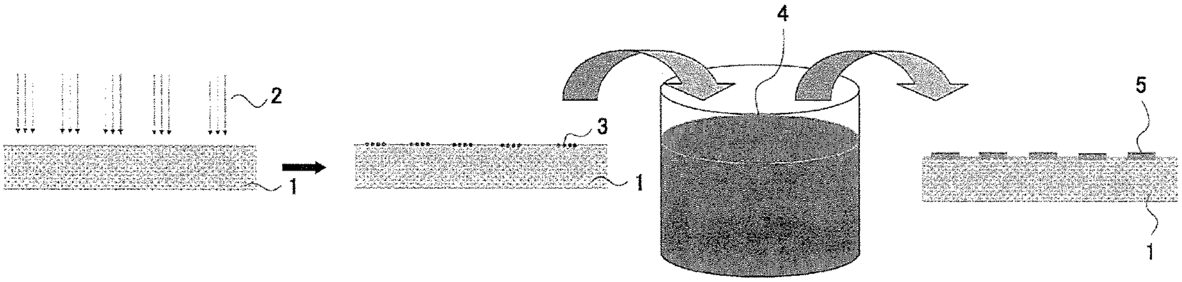
2
1
3
1
4
5
1

RESIN COMPOSITION, MOLDED ARTICLE, AND METHOD FOR MANUFACTURING PLATED MOLDED ARTICLE

TECHNICAL FIELD

This invention relates to a resin composition, a molded article, and a method for manufacturing a plated molded article, and particularly to a resin composition which is applicable to laser direct structuring (may occasionally be referred to as "LDS", hereinafter) technology capable of forming a plating layer directly on the surface of the molded article.

BACKGROUND ART

A technology for fabricating an antenna, capable of supporting three dimensional design, has been demanded in a variety of applications including mobile phone, various 5G-compatible devices, vehicle-borne communication system, and base station. Laser direct structuring technology has attracted public attention, as one known technology for fabricating such three-dimensional antenna. LDS is a technology by which laser light is irradiated on a surface of a molded article (resin molded article) that contains an LDS additive for activation, and a metal is then applied to the activated area to form a plating layer. An advantage of the technology resides in capability of fabricating a metal structure such as antenna, directly onto the surface of the resin molded article, without using an adhesive or the like.

In some type of applications including antenna, high relative permittivity (Dk) and low loss tangent (Df) would be advantageous properties for the resin molded article. Patent Literature 1 discloses a resin composition for use in LDS, capable of achieving high relative permittivity and low loss tangent.

CITATION LIST

Patent Literature

[Patent Literature 1] US2009/0292051

SUMMARY OF THE INVENTION

Technical Problem

In this situation, the present inventors found from our investigations that addition of a predetermined LDS, having high relative permittivity, could achieve high relative permittivity, while keeping the loss tangent to a low level. Addition of the LDS additive having high relative permittivity was, however, occasionally found to induce decomposition of a thermoplastic resin, and to degrade the mechanical strength.

It is therefore an object of this invention, aimed at solving the issue, to provide a resin composition having high relative permittivity, while keeping low loss tangent, and excellent mechanical strength; a molded article; and a method for manufacturing a plated molded article.

Solution to Problem

The present inventors conducted research to address the above-mentioned problems, and as a result, discovered that the above-mentioned problems could be solved by mixing the acid-modified polymer. Specifically, the problems described above are solved by the following means.

<1> A resin composition comprising: per 100 parts by mass of a thermoplastic resin, 0.3 to 10 parts by mass an acid-modified polymer; 5 to 150 parts by mass of a laser direct structuring additive; and 10 to 150 parts by mass of a reinforcing fiber, the laser direct structuring additive being a compound being a conductive oxide having a resistivity of $5\times10^3$ Ω·cm or smaller, and containing at least one type selected from a Group n (n represents an integer of 3 to 16) metal in the periodic table and a Group n+1 metal, or, calcium copper titanate.

<2> The resin composition of <1>, wherein the thermoplastic resin contains at least type one of polycarbonate resin, polyphenylene ether resin, polyester resin, and polyamide resin.

<3> The resin composition of <1>, wherein the thermoplastic resin contains a polycarbonate resin.

<4> The resin composition of <3>, wherein the polycarbonate resin contains a structural unit represented by formula (1),

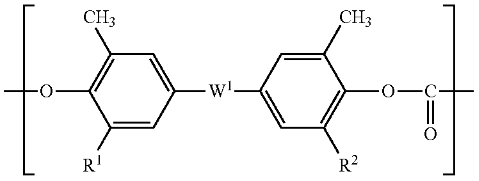

(1)

(in formula (1), each of $R^1$ and $R^2$ independently represents a hydrogen atom or a methyl group, and $W^1$ represents a single bond or a divalent group).

<5> The resin composition of <4>, wherein the structural unit represented by formula (1) accounts for 10 to 100 mol % of all structural units, but excluding a terminal group, of the polycarbonate resin.

<6> The resin composition of <1>, wherein the thermoplastic resin contains a polybutylene terephthalate resin.

<7> The resin composition of any one of <1> to <6>, wherein the acid-modified polymer contains an acid-modified olefin polymer.

<8> The resin composition of any one of <1> to <7>, wherein the reinforcing fiber demonstrates a relative permittivity of smaller than 25, when measured at a frequency of 900 MHz.

<9> The resin composition of any one of <1> to <8>, wherein the reinforcing fiber contains at least one type selected from glass fiber and wollastonite.

<10> The resin composition of any one of <1> to <9>, wherein a content of the laser direct structuring additive in the resin composition exceeds 30% by mass.

<11> The resin composition of any one of <1> to <9>, wherein a content of the laser direct structuring additive in the resin composition exceeds 20% by mass.

<12> The resin composition of any one of <1> to <11>, wherein a molded article formed of the resin composition demonstrates a relative permittivity of 4.0 or larger, and a loss tangent of 0.020 or smaller, when measured at least one point in a frequency range from 1 to 10 GHz.

<13> The resin composition of any one of <1> to <12>, further comprising a flame retardant.

<14> The resin composition of any one of <1> to <13>, further comprising an elastomer.

<15> The resin composition of any one of <1> to <14>, wherein a content of the ceramic filler (excluding anything that applies to the laser direct structuring additive) in the resin composition is 0 parts by mass or more, and less than 10 parts by mass.

<16> The resin composition of any one of <1> to <15>, wherein the laser direct structuring additive is a compound being a conductive oxide having a resistivity of $5\times10^3$ Ω·cm or smaller, and containing a Group n metal in the periodic table and a Group n+1 metal, wherein n represents an integer of 10 to 13.

<17> The resin composition of <16>, wherein the laser direct structuring additive is a compound having zinc as the Group n metal in the periodic table, and aluminum as the Group n+1 metal.

<18> The resin composition of any one of <1> to <17>, wherein the acid-modified polymer has an acid value of 0.5 mgKOH/g or larger.

<19> The resin composition of any one of <1> to <18>, wherein a mass ratio of the laser direct structuring additive and the acid-modified polymer (laser direct structuring additive/acid-modified polymer) is 10 to 200.

<20> A molded article formed of the resin composition described in any one of <1> to <19>.

<21> The molded article of <20>, having on the surface thereof a plating layer.

<22> The molded article of <21>, wherein the plating layer has an antenna performance.

<23> The molded article of any one of <20> to <22>, being a mobile electronic equipment component.

<24> A method for manufacturing a plated molded article, the method comprising irradiating laser light on a molded article formed of the resin composition described in any one of <1> to <19>, and then applying a metal to form a plating layer.

Advantageous Effects of Invention

According to this invention, it became possible to provide a resin composition having high relative permittivity, while keeping low loss tangent, and excellent mechanical strength; a molded article; and a method for manufacturing a plated molded article.

BRIEF DESCRIPTION OF DRAWING

FIG. 1 A schematic drawing illustrating a step of providing a plating layer on the surface of a molded article.

DESCRIPTION OF EMBODIMENTS

Embodiments for carrying out this invention (simply referred to as “this embodiment”, hereinafter) will be detailed below. The embodiments below are merely illustrative, so that this invention is not limited solely to these embodiments.

Note that all numerical ranges given in this patent specification, with “to” preceded and succeeded by numerals, are used to represent the ranges including these numerals respectively as the lower and upper limit values.

Various physical properties and characteristic values mentioned in this patent specification are those demonstrated at 23° C., unless otherwise specifically noted.

Various standards mentioned in this patent specification, whose measurement method and so forth might be modified by year, are based on the standards as of Jul. 28, 2020, unless otherwise specifically noted.

The resin composition of this embodiment contains, per 100 parts by mass of a thermoplastic resin, 0.3 to 10 parts by mass of an acid-modified polymer, 5 to 150 parts by mass of a laser direct structuring (LDS) additive, and 10 to 150 parts by mass of a reinforcing fiber, wherein the laser direct structuring additive is a compound being a conductive oxide having a resistivity of $5\times10^3$ Ω·cm or smaller, and containing at least one type selected from a Group n (n represents an integer of 3 to 16) metal in the periodic table and a Group n+1 metal, or, calcium copper titanate. With such structure, obtainable is a resin composition having high relative permittivity, while keeping low loss tangent, and excellent mechanical strength.

A possible reason is as follows. That is, the LDS additive used in this embodiment, although beneficial in terms of elevating the relative permittivity without elevating the loss tangent, was presumed to induce decomposition of the thermoplastic resin. Now, addition of the acid-modified polymer was presumed to suppress the decomposition of the thermoplastic resin, and therefore to suppress the mechanical strength from degrading. Although the LDS additive used in this embodiment particularly tends to lower the mechanical strength of the resin composition when densely filled, this embodiment was presumably capable of effectively suppressing the decomposition the thermoplastic resin by mixing the acid-modified polymer, even if the LDS additive were densely filled.

The resin composition of this embodiment will be described below.

<Thermoplastic Resin>

The resin composition of this embodiment contains a thermoplastic resin.

The thermoplastic resin used in this embodiment is exemplified by polycarbonate resin, polyphenylene ether resin, polyester resin, polyamide resin, polyolefin resin (preferably polypropylene resin and polyethylene resin) and acrylic resin, and preferably contains at least type one of polycarbonate resin, polyphenylene ether resin, polyester resin, or polyamide resin.

A preferred example of the thermoplastic resin in this embodiment contains polycarbonate resin, wherein the polycarbonate resin accounts for 90% by mass or more (preferably 95% by mass or more) of the resin composition.

Other preferred example of the thermoplastic resin in this embodiment contains polyphenylene ether resin, wherein the polyphenylene ether resin accounts for 90% by mass or more (preferably 95% by mass or more) of the resin composition.

Other preferred example of the thermoplastic resin in this embodiment contains polyester resin (preferably polybutylene terephthalate resin), wherein the polyester resin (preferably polybutylene terephthalate resin) accounts for 90% by mass or more (more preferably 95% by mass or more) of the resin composition.

Other preferred example of the thermoplastic resin in this embodiment contains polyamide resin (preferably, xylylenediamine-based polyamide resin described later), wherein the polyamide resin (preferably, xylylenediamine-based polyamide resin described later) accounts for 90% by mass or more (preferably 95% by mass or more) of the resin composition.

Other preferred example of the thermoplastic resin in this embodiment contains polycarbonate resin and polyester resin (preferably, polybutylene terephthalate resin), wherein the polycarbonate resin and the polyester resin (preferably, polybutylene terephthalate resin) account for 90% by mass or more (preferably 95% by mass or more) of the resin composition. Blend ratio of the polycarbonate resin and the polyester resin in this embodiment is preferably (1 to 99):(99 to 1) in terms of mass ratio, more preferably (1 to 30):(99 to 70), and even more preferably (5 to 20):(95 to 80).

<Polycarbonate Resin>>

The polycarbonate resin is not specifically limited, for which any of aromatic polycarbonate, aliphatic polycarbonate, or aromatic-aliphatic polycarbonate is employable. Among them, preferred is aromatic polycarbonate, and more preferred is thermoplastic aromatic polycarbonate polymer or copolymer, obtainable by reacting an aromatic dihydroxy compound with phosgene or a carbonate diester.

The aromatic dihydroxy compound is exemplified by 2,2-bis (4-hydroxyphenyl) propane (=bisphenol A), tetramethylbisphenol A, bis (4-hydroxyphenyl)-p-diisopropylbenzene, hydroquinone, resorcinol, and 4,4-dihydroxybiphenyl, and is preferably exemplified by bisphenol A. For the purpose of preparing a resin composition having further enhanced flame retardancy, employable are the aforementioned aromatic dihydroxy compound having bound thereto one or more tetraalkylphosphonium sulfonates, or polymer or oligomer having a siloxane structure and phenolic OH groups at both terminals.

A method for producing the polycarbonate resin is not specifically limited, and any of polycarbonate resins produced by the phosgene method (interfacial polymerization), melting method (transesterification), and so forth is applicable to this embodiment. Also a polycarbonate resin produced by an ordinary production process of the melting method, followed by a process of controlling the terminal OH group content, may be used for this embodiment.

In addition, not only a polycarbonate resin as a virgin material, but also a polycarbonate resin reprocessed from used products, which is so-called recycled polycarbonate resin, may be used as the polycarbonate resin in this embodiment.

The polycarbonate resin in this embodiment may also be a polycarbonate resin that contains a structural unit represented by formula (1). With use of such polycarbonate resin, the loss tangent may further be reduced.

(1)

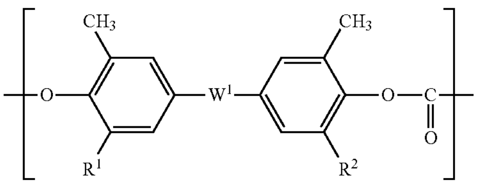

(In formula (1), each of $R^1$ and $R^2$ independently represents a hydrogen atom or a methyl group, and $W^1$ represents a single bond or a divalent group.)

In formula (1), each of $R^1$ and $R^2$ independently represents a hydrogen atom or a methyl group. With each of $R^1$ and $R^2$ representing a hydrogen atom, the molded article of this embodiment will tend to have further improved weatherability. With each of $R^1$ and $R^2$ representing a methyl group, the molded article of this embodiment will tend to have further improved heat resistance and moist heat stability. $R^1$ and $R^2$ may therefore be selectable depending on needs, for which hydrogen atom is more preferred.

In formula (1), $W^1$ represents a single bond or a divalent group. The divalent group is exemplified by oxygen atom, sulfur atom, divalent organic group, and groups formed by combining them. The divalent organic group is preferred.

The divalent organic group for use is suitably selectable from known ones without special limitation, and is exemplified by any of organic groups represented by formulae (2a) to (2h) below, wherein formula (2a) is preferred.

(2a)

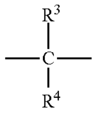

(2b)

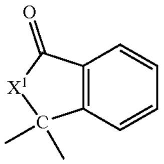

(2c)

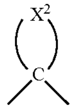

(2d)

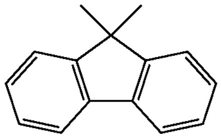

(2e)

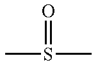

(2f)

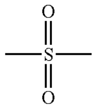

(2g)

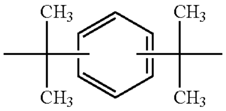

(2h)

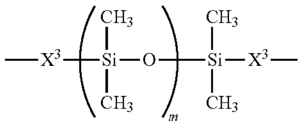

In formula (2a), each of $R^3$ and $R^4$ independently represents a hydrogen atom, a monovalent hydrocarbon group having 1 to 24 carbon atoms, or an alkoxy group having 1 to 24 carbon atoms, among them monovalent hydrocarbon group having 1 to 24 carbon atoms is preferred.

The monovalent hydrocarbon group having 1 to 24 carbon atoms is exemplified alkyl group having 1 to 24 carbon atoms, alkenyl group having 2 to 24 carbon atoms, optionally substituted aryl group having 6 to 24 carbon atoms, and arylalkyl group having 7 to 24 carbon atoms. The alkyl group having 1 to 24 carbon atoms is preferred.

The alkyl group having 1 to 24 carbon atoms is exemplified by straight-chain or branched alkyl group, and partially cyclic-structured alkyl groups. Among them, the straight-chain alkyl group is preferred. The alkyl group having 1 to 24 carbon atoms is exemplified by methyl group, ethyl group, n-propyl group, n-butyl group, n-pentyl group, n-hexyl group, n-heptyl group, and n-octyl group, and is preferably methyl group.

The alkenyl group having 2 to 24 carbon atoms is exemplified by straight-chain or branched alkenyl group, and partially cyclic-structured alkenyl group, among them straight-chain alkenyl group is preferred. The straight-chain alkenyl group having 2 to 24 carbon atoms is exemplified by vinyl group, n-propenyl group, n-butenyl group, n-pentenyl group, n-hexenyl group, n-heptenyl group, and n-octenyl group, and is preferably vinyl group.

The aryl group having 6 to 24 carbon atoms is exemplified by phenyl group, naphthyl group, and aryl groups which may optionally have substituent such as alkyl group, including methylphenyl group, dimethylphenyl group, and trimethylphenyl group. The arylalkyl group having 7 to 24 carbon atoms is exemplified by benzyl group.

The alkoxy group having 1 to 24 carbon atoms is exemplified by straight-chain, branched, and partially cyclic-structured alkoxy groups, among them straight-chain alkoxy group is preferred. The straight-chain alkoxy group is specifically exemplified by methoxy group, ethoxy group, propoxy group, and butoxy group.

In formula (2b), $X^1$ represents an oxygen atom or $NR^a$. Now, $R^a$ is synonymous to the aforementioned $R^3$ and $R^4$.

In formula (2c), $X^2$ represents a divalent hydrocarbon group having 3 to 18 carbon atoms, and is exemplified by propylene group, butylene group, pentylene group, hexylene group, heptylene group, octylene group, nonylene group, decylene group, undecylene group, and dodecylene group, wherein each of them may further have a substituent. The substituent is exemplified by methyl group, ethyl group, propyl group, butyl group, pentyl group, and phenyl group. $X^2$ may further have a crosslinked structure.

Formula (2c) is preferably represented by formula (2i).

(2i)

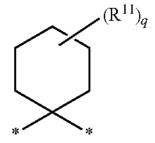

In formula (2i), each $R^{11}$ independently represents a monovalent hydrocarbon group having 1 to 24 carbon atoms, or an alkoxy group having 1 to 24 carbon atoms. Details of the monovalent hydrocarbon group having 1 to 24 carbon atoms and the alkoxy group having 1 to 24 carbon atoms are same as $R^3$ in formula (2a).

q Represents an integer of 0 to 3, wherein 0 is preferred.

Represents a bonding site with other group.

In formula (2h), $X^3$ represents an alkylene group having 1 to 7 carbon atoms. The alkylene group may have a straight-chain or a branched chain or may have a cyclic structure, and is exemplified by methylene group, ethylene group, propylene group, and butylene group.

m Represents an integer of 1 to 500, which is more preferably 5 to 300, and even more preferably 10 to 100.

The structural unit represented by formula (1) is more preferably a structural unit represented by formula (3) or formula (4), wherein the structural unit represented by formula (3) is more preferred. With these structural unit contained therein, the effects of this invention will be more effectively demonstrated.

(3)

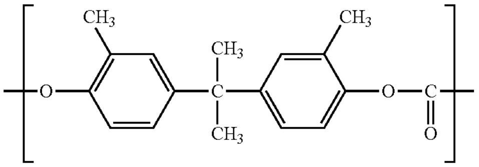

(4)

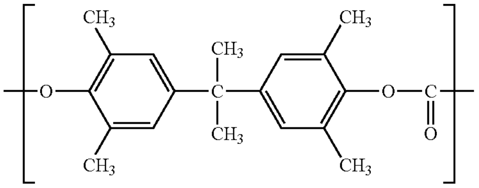

The polycarbonate resin, when containing the structural unit represented by formula (1), may be such that all structural units other than the terminal group may be formed of the structural unit represented by formula (1); may be a blend of a polycarbonate resin formed of the structural unit represented by formula (1), and a polycarbonate resin formed of a structural unit other than the structural unit represented by formula (1); or may be a copolymerized polycarbonate resin formed of a structural unit represented by formula (1), and a structural unit other than the structural unit represented by formula (1).

The structural unit other than the structural unit represented by formula (1) is exemplified by a structural unit below.

(5)

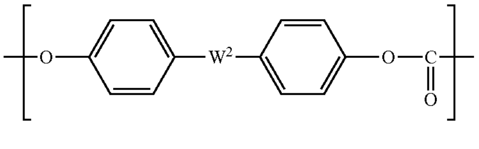

In formula (5), $W^2$ is synonymous to the aforementioned $W^1$, also accompanied by the same preferred ranges. Formula (2a) is particularly preferred.

The polycarbonate resin used in this embodiment, when containing a structural unit represented by formula (1) and other structural unit (for example, a structural unit represented by formula (5)), the structural unit represented by formula (1) preferably accounts for 10 to 100 mol % of all structural units (but excluding the terminal group) of the polycarbonate resin contained in the resin composition, and more preferably accounts for 10 to 30 mol %. Note, in a case where there are two or more kinds of polycarbonate resin, "all structural units" means all structural units contained in such two or more kinds of polycarbonate resin.

Preferred specific examples of the polycarbonate resin used in this embodiment include below:

A) polycarbonate resin in which the structural unit represented by formula (5) accounts 90 mol % or more of all structural units, but excluding a terminal group (bisphenol A-type polycarbonate resin, etc.); and B) polycarbonate resin in which the structural unit represented by formula (1) and the structural unit represented by formula (5) account for 90 mol % or more of all structural unit, but excluding a terminal group (blend of bisphenol A-type polycarbonate resin and bisphenol C-type polycarbonate resin, bisphenol A- and C-type polycarbonate resins (copolymer), etc.).

The polycarbonate resin usable in in this embodiment preferably has a molecular weight, which is in terms of viscosity-average molecular weight (Nv) calculated from solution viscosity measured in methylene chloride as a solvent at 25° C., of 10,000 or larger, and more preferably 15,000 or larger. Meanwhile, the viscosity-average molecular weight is preferably 32,000 or smaller, and more preferably 28,000 or smaller. At the lower limit value or above, the molded article will tend to further improve the mechanical properties, meanwhile at the upper limit value of below, workability during injection molding will tend to further improve.

Two or more kinds of polycarbonate resin with different viscosity-average molecular weights may be mixed for use, even allowing use of polycarbonate resins whose viscosity-average molecular weight falls outside the aforementioned preferred ranges, wherein the viscosity-average molecular weight of the mixture preferably falls within the aforementioned ranges.

Now the viscosity-average molecular weight [Mv] is calculated from the Schnell's viscosity equation $\eta=1.23\times10^{-4}\,Mv^{0.83}$, where extreme viscosity [η] (in dL/g) is measured at 25° C. in methylene chloride as a solvent, with use of a Ubbelohde viscometer. The extreme viscosity [η] is calculated from the equation below, after measuring specific viscosity [$\eta_{sp}$] values at varied solution concentrations [C] (g/dL).

$$\eta = \lim_{c \to 0} \eta_{sp} / c$$

Other features of the polycarbonate resin used in this embodiment may be understood from the descriptions in paragraphs [0018] to [0066] of JP-2012-072338 A, and paragraphs of [0011] to [0018] of JP-2015-166460 A, the contents of which are incorporated by reference into this patent specification.

<<Polyphenylene Ether Resin>>

The polyphenylene ether resin used in this embodiment may be any of known ones, which are exemplified by a polymer having a structural unit represented by formula below in the principal chain (preferably, a polymer in which the structural unit represented by formula below accounts for 90 mol % or more of all structural units, but excluding a terminal group). The polyphenylene ether resin may be either homopolymer or copolymer.

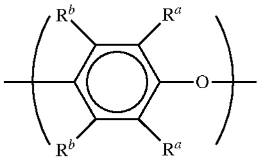

(In the formula, each of two ($R^a$)s independently represents a hydrogen atom, a halogen atom, a primary or secondary alkyl group, an aryl group, an aminoalkyl group, a halogenated alkyl group, a hydrocarbonoxy group, or halogenated hydrocarbonoxy group; and each of two ($R^b$) s independently represents a hydrogen atom, a halogen atom, a primary or secondary alkyl group, an aryl group, a halogenated alkyl group, a hydrocarbonoxy group, or a halogenated hydrocarbonoxy group. Note that both of two ($R^a$) s do not represent a hydrogen atom at the same time.)

Each of $R^a$ and $R^b$ independently and preferably represents a hydrogen atom, a primary or a secondary alkyl group, or an aryl group. The primary alkyl group is preferably exemplified by methyl group, ethyl group, n-propyl group, n-butyl group, n-amyl group, isoamyl group, 2-methylbutyl group, 2,3-dimethylbutyl group, 2-, 3- or 4-methylpentyl group or heptyl group. The secondary alkyl group is preferably exemplified by isopropyl group, sec-butyl group or 1-ethylpropyl group. In particular, $R^a$ preferably represents a primary or secondary alkyl group having 1 to 4 carbon atoms, or a phenyl group. $R^b$ preferably represents a hydrogen atom.

The homopolymer of the polyphenylene ether resin is preferably exemplified by 2,6-dialkyl phenylene ether polymers such as poly(2,6-dimethyl-1,4-phenylene) ether, poly (2,6-diethyl-1,4-phenylene ether), poly(2,6-dipropyl-1,4-phenylene ether), poly(2-ethyl-6-methyl-1,4-phenylene ether), or poly(2-methyl-6-propyl-1,4-phenylene ether). The copolymer is exemplified by 2,6-dialkyl phenol/2,3,6-trialkyl phenol copolymers such as 2,6-dimethylphenol/2,3,6-trimethylphenol copolymer, 2,6-dimethylphenol/2,3,6-triethylphenol copolymer, 2,6-diethylphenol/2,3,6-trimethylphenol copolymer, and 2,6-dipropylphenol/2,3,6-trimethylphenol copolymer; graft copolymer obtained by graft polymerization of styrene to poly(2,6-dimethyl-1,4-phenylene ether); and graft copolymer obtained by graft polymerization of styrene to 2,6-dimethylphenol/2,3,6-trimethylphenol copolymer.

The polyphenylene ether resin in this embodiment is particularly preferably poly(2,6-dimethyl-1,4-phenylene) ether, or 2,6-dimethylphenol/2,3,6-trimethylphenol random copolymer. Also a polyphenylene ether resin described in JP-2005-344065 A, with a specified number of terminal groups and specified copper content, is suitably used.

The polyphenylene ether resin preferably has a specific viscosity, measured at 30° C. in chloroform, of 0.2 to 0.8 dL/g, which is more preferably 0.3 to 0.6 dL/g. With the specific viscosity controlled to 0.2 dL/g or larger, the resin composition will tend to further improve the mechanical strength, meanwhile with the specific viscosity controlled to 0.8 dL/g or smaller, the resin composition will tend to further improve the fluidity, making molding easier. Alternatively, two or more kinds of polyphenylene ether resin having different values of specific viscosity may be used together, within the aforementioned ranges of specific viscosity.

A method for producing the polyphenylene ether resin used for this embodiment may follow any of known methods without special limitation. An applicable method relies upon oxidation polymerization of a monomer such as 2,6-dimethylphenol, in the presence of an amine-copper catalyst, during which proper selection of reaction conditions makes it possible to control the specific viscosity within a desired range. The specific viscosity is controllable by proper selection of the conditions including polymerization temperature, polymerization time, amount of catalyst, and so forth.

<<Polyester Resin>>

The polyester resin used here may be any of known thermoplastic polyester resins, for which polyethylene terephthalate resin and polybutylene terephthalate resin are preferred, and preferably contains at least polybutylene terephthalate resin.

As is well known, the polyethylene terephthalate resin or the polybutylene terephthalate resin has been mass-produced by a reaction of terephthalic acid and/or ester thereof, with ethylene glycol and/or 1,4-butanediol, and has been marketed. Any of these resins available in the market may be used in this embodiment. Although some of the resins available in the market might contain a copolymerization component other than terephthalic acid component and ethylene glycol component and/or 1,4-butanediol component, this embodiment can employ the resin containing such copolymerization component whose content is preferably 3 to 40% by mass, more preferably 5 to 30% by mass, and even more preferably 10 to 25% by mass.

The polyethylene terephthalate resin usually has a specific viscosity of 0.4 to 1.0 dL/g, which is particularly preferably 0.5 to 1.0 dL/g. With the specific viscosity controlled to the lower limit value or above, the resin composition will be less likely to degrade the mechanical properties, meanwhile, when controlled to the upper limit or below, the resin composition will easily maintain the fluidity.

The specific viscosity of the polybutylene terephthalate resin is usually 0.5 to 1.5 dL/g, and particularly preferably 0.6 to 1.3 dL/g. At or above the lower limit value, the resin composition with excellent mechanical strength will be more easily obtainable. Meanwhile, at or below the upper limit value, the resin composition will tend to excel in moldability, without losing the fluidity.

The specific viscosity values of both polyester resins are measured at 30° C., in phenol/tetrachloroethane (mass ratio=1/1) mixed solvent.

Content of the terminal carboxy group of the polyester resin (preferably polybutylene terephthalate resin) is usually 60 eq/ton or less, preferably 50 eq/ton or less, and more preferably 30 eq/ton or less. At or below 60 eq/ton, the alkali resistance and hydrolysis resistance will improve, and outgas will be less likely to occur during melt molding of the resin composition. The lower limit value of the content of the terminal carboxy group is usually, but not specifically limited to, 10 eq/ton in consideration of productivity of the polyester resin.

The content of the terminal carboxy group of the polyester resin may be determined by dissolving 0.5 g of the resin in 25 mL of benzyl alcohol, and by titrating the mixture with a 0.01 mol/L sodium hydroxide solution in benzyl alcohol.

The polybutylene terephthalate resin may be modified by copolymerization, wherein such copolymer is exemplified by polyester ether resin copolymerized with polyalkylene glycols particularly with polytetramethylene glycol, polybutylene terephthalate resin copolymerized with dimer acid, and polybutylene terephthalate resin copolymerized with isophthalic acid. These copolymers are defined by those whose amount of copolymerization is 1 mol % or more, and less than 50 mol %, of all segments of the polybutylene terephthalate resin. In particular, the amount of copolymerization is preferably 2 to 50 mol %, more preferably 3 to 40 mol %, and particularly preferably 5 to 20 mol %. Details of them may be understood referring to paragraphs [0014] to [0022] of JP-2019-006866 A, the content of which is incorporated by reference into this patent specification.

The polyester resin, besides those described above, may be understood referring to the description in paragraphs [0013] to [0016] of JP-2010-174223 A, the contents of which is incorporated by reference into this patent specification.

<Polyamide Resin>>

The polyamide resin is a polymer having, as a structural unit, an acid amide obtained by ring-opening polymerization of lactam, polycondensation of aminocarboxylic acid, or polycondensation of diamine and dibasic acid, and is specifically exemplified by polyamides 6, 11, 12, 46, 66, 610, 612, 6I, 6/66, 6T/6I, 6/6T, 66/6T, and 66/6T/6I, xylylenediamine-based polyamide resin detailed later, polytrimethylhexamethylene terephthalamide, polybis(4-aminocyclohexyl)methane dodecamide, polybis(3-methyl-4-aminocyclohexyl)methane dodecamide, and polyundecamethylene hexahydroterephthalamide. Note that "I" represents an isophthalic acid component, and "T" represents a terephthalic acid component. The polyamide resin may be understood referring to paragraphs [0011] to [0013] of JP-2011-132550 A, the contents of which are incorporated by reference in this patent specification.

The polyamide resin used in this embodiment is preferably a xylylenediamine-based polyamide resin that includes a diamine-derived structural unit and a dicarboxylic acid-derived structural unit, wherein 50 mol % or more of the diamine-derived structural unit is derived from xylylene diamine. More preferably 70 mol % or more, even more preferably 80 mol % or more, yet more preferably 90 mol % or more, and furthermore preferably 95 mol % or more of the diamine-derived structural unit of the xylylenediamine-based polyamide resin is derived at least either from metaxylylene diamine or paraxylylene diamine. Preferably 50 mol % or more, more preferably 70 mol % or more, even more preferably 80 mol % or more, yet more preferably 90 mol % or more, and furthermore preferably 95 mol % or more of the dicarboxylic acid-derived structural unit of the xylylenediamine-based polyamide resin is derived from the straight-chain aliphatic α, Ω-dicarboxylic acid having 4 to 20 carbon atoms. The straight-chain aliphatic α, Ω-dibasic acid having 4 to 20 carbon atoms suitably used includes adipic acid, sebacic acid, suberic acid, dodecanedioic acid, and eicosanedionic acid, wherein adipic acid and sebacic acid are further preferred.

Diamine other than metaxylylene diamine or paraxylylene diamine, usable as the raw diamine component of the xylylenediamine-based polyamide resin, is exemplified by aliphatic diamines such as tetramethylenediamine, pentamethylenediamine, 2-methylpentanediamine, hexamethylenediamine, heptamethylenediamine, octamethylenediamine, nonamethylenediamine, decamethylenediamine, dodecamethylenediamine, 2,2,4-trimethyl-hexamethylenediamine, and 2,4,4-trimethylhexamethylenediamine; alicyclic diamines such as 1,3-bis(aminomethyl)cyclohexane, 1,4-bis (aminomethyl)cyclohexane, 1,3-diaminocyclohexane, 1,4-diaminocyclohexane, bis(4-aminocyclohexyl)methane, 2,2-bis(4-aminocyclohexyl)propane, bis(aminomethyl)decalin, and bis(aminomethyl)tricyclodecane; and aromatic ring-containing diamines such as bis(4-aminophenyl) ether, paraphenylenediamine, and bis(aminomethyl)naphthalene, wherein all of these compounds may be used singly or in combination.

The dicarboxylic acid component other than the straight-chain aliphatic α, Ω-dicarboxylic acid having 4 to 20 carbon atoms is exemplified by phthalic acid compounds such as isophthalic acid, terephthalic acid, and orthophthalic acid; and isomers of naphthalene dicarboxylic acid such as 1,2-naphthalene dicarboxylic acid, 1,3-naphthalene dicarboxylic acid, 1,4-naphthalene dicarboxylic acid, 1,5-naphthalene dicarboxylic acid, 1,6-naphthalene dicarboxylic acid, 1,7-naphthalene dicarboxylic acid, 1,8-naphthalene dicarboxylic acid, 2,3-naphthalene dicarboxylic acid, 2,6-naphthalene dicarboxylic acid, and 2,7-naphthalene dicarboxylic acid, wherein all of these compounds may be used singly or in combination.

Content of the thermoplastic resin in the resin composition of this embodiment is preferably 25% by mass or more, more preferably 30% by mass or more, and even more preferably 35% by mass or more. At or above the lower limit value, the molded article will tend to improve the mechanical strength. The content of the thermoplastic resin in the resin composition of this embodiment is preferably 65% by mass or less, more preferably 60% by mass or less, and even more preferably 55% by mass or less. At or below the upper limit value, the relative permittivity will tend to elevate.

The resin composition of this embodiment may contain only one kind of, or two or more kinds of these thermoplastic resins. In a case where two or more kinds are contained, the total content preferably falls within the aforementioned ranges.

<Acid-Modified Polymer>

The resin composition of this embodiment contains 0.3 to 10 parts by mass of the acid-modified polymer, per 100 parts by mass of the thermoplastic resin. The acid-modified polymer contained therein can effectively suppress the thermoplastic resin from being decomposed by the LDS additive.

The polymer composing the acid-modified polymer is preferably olefin polymer or styrene polymer, more preferably olefin polymer, and even more preferably polyethylene.

The olefin polymer is preferably homopolymer or copolymer of $\alpha$-olefin such as ethylene or propylene; or copolymer of $\alpha$-olefin with other monomer. The copolymer of $\alpha$-olefin with other monomer is preferably ethylene-based rubber such as ethylene-propylene rubber or ethylene butene rubber.

Acid used for acid modification of the acid-modified polymer may be acid or acid anhydride, wherein acid anhydride is preferred. More specifically, the acid used for acid modification of the acid-modified polymer is preferably any of organic acids or acid anhydrides thereof, more preferably carboxylic acids or carboxylic anhydrides, even more preferably maleic acid or maleic anhydride, and yet more preferably maleic anhydride.

That is, the acid-modified polymer used in this embodiment is preferably a maleic anhydride-modified olefin polymer.

The acid-modified polymer in this embodiment has an acid value exceeding 0 mgKOH/g, preferably 0.5 mgKOH/g or larger, more preferably 2 mgKOH/g or larger, even more preferably 5 mgKOH/g or larger, yet more preferably 10 mgKOH/g or larger, and may be 15 mgKOH/g or larger depending on applications. At or above the lower limit value, the thermoplastic resin will tend to be effectively suppressed from decomposing. Meanwhile, the upper limit value of the acid value of the acid-modified polymer is preferably 100 mgKOH/g or below, more preferably 90 mgKOH/g or below, even more preferably 80 mgKOH/g or below, and may be 70 mgKOH/g or below, 60 mgKOH/g or below, 50 mgKOH/g or below, 40 mgKOH/g or below, and 35 mgKOH/g or below depending on applications. At or below the upper limit value, the thermoplastic resin will tend to effectively suppress the mechanical strength from degrading.

In a case where the resin composition of this embodiment contains two or more kinds of the acid-modified polymer, the acid value is given as an acid value of the mixture.

Content of the acid-modified polymer in the resin composition of this embodiment is 0.3 parts by mass or more, per 100 parts by mass of the thermoplastic resin, more preferably 0.5 parts by mass or more, and even more preferably 0.8 parts by mass or more. At or above the lower limit value, the thermoplastic resin will tend to be effectively suppressed from decomposing. The content of the acid-modified polymer in the resin composition of this embodiment is 10 parts by mass or less, per 100 parts by mass of the thermoplastic resin, more preferably 8 parts by mass or less, even more preferably 6 parts by mass or less, yet more preferably 4 parts by mass or less, and furthermore preferably 3 parts by mass or less. At or below the upper limit value, the outgas during molding will tend to be more effectively suppressed.

The resin composition of this embodiment may contain only one kind of, or two or more kinds of the acid-modified polymer. In a case where two or more kinds are contained, the total content preferably falls within the aforementioned ranges.

<Laser Direct Structuring (LDS) Additive>

The resin composition of this embodiment contains additive 5 to 150 parts by mass of laser direct structuring, per 100 parts by mass of the thermoplastic resin. With the LDS additive contained therein, an obtainable molded article will have the surface on which a plating layer can be formed.

The LDS additive used in this embodiment is a conductive oxide having a resistivity of $5\times10^3$ Ω·cm or smaller; which is at least one type selected from a compound that contains a Group n metal (n represents an integer of 3 to 16) in the periodic table and a Group n+1 metal, or calcium copper titanate; and is preferably a compound being a conductive oxide having a resistivity of $5\times10^3$ Ω·cm or smaller, and containing a Group n metal (n represents an integer of 3 to 16) in the periodic table and a Group n+1 metal. With such LDS additive used therein, the resin composition will have elevated relative permittivity, without elevating the loss tangent.

The resistivity of the conductive oxide is preferably $8\times10^2$ Ω·cm or smaller, more preferably $7\times10^2$ Ω·cm or smaller, and even more preferably $5\times10^2$ Ω·cm or smaller. The lower limit value, although not specifically limited, may typically be $1\times10^1$ Ω·cm or larger for example, and may further be $1\times10^2$ Ω·cm or larger.

The resistivity of the conductive oxide in this embodiment is usually given in terms of powder resistivity, which may be measured with use of a "Model 3223" tester from Yokogawa Electric Corporation, after packing 10 g of pulverized conductive oxide in a 25 mm diameter cylinder with Teflon (registered trademark) inner lining, and then pressurizing the powder at 100 kgf/cm$^2$ (packing ratio=20%).

The conductive oxide used in this embodiment is a compound that contains a Group n metal (n represents an integer of 3 to 16) in the periodic table, and a Group n+1 metal, wherein n more preferably represents an integer of 10 or larger, which is more preferably 12 or larger; meanwhile, the integer is more preferably 15 or smaller, more preferably 14 or smaller, and even more preferably 13 or smaller. n More preferably represents 12 or 13, and even more preferably represents 12.

The LDS additive used in this embodiment is specifically exemplified by a compound having zinc for the Group n metal in the periodic table, and aluminum for the Group n+1 metal in the periodic table; and a compound having tin for the Group n metal in the periodic table, and antimony for the Group n+1 metal in the periodic table, among them the compound having zinc for the Group n metal in the periodic table, and aluminum for the Group n+1 metal in the periodic table is more preferred. The compound having zinc for the Group n metal in the periodic table and aluminum for the Group n+1 metal in the periodic table, when mixed with the flame retardant, is less likely to interfere an action of the flame retardant, and can effectively enhance the flame retardancy.

Assuming now the content of the Group n metal (n represents an integer of 3 to 16) and the content of the Group (n+1) metal in the periodic table totals 100 mol % in the LDS additive used in this embodiment, the content of either one metal is preferably 15 mol % or less, more preferably 12 mol % or less, and particularly 10 mol % or less. The lower limit is preferably, but not specially limited to, 0.0001 mol % or above. With the contents of two or more metals thus controlled within these ranges, the platability can be improved. In this embodiment, the Group n metal oxide doped with the Group (n+1) metal is particularly preferred.

Moreover, in the LDS additive used in this embodiment, the contents of the Group n metal and the Group (n+1) metal in the periodic table preferably account for 98% by mass or more of the metal component contained in the LDS additive.

The Group n metal in the periodic table is exemplified by those in Group 3 (scandium, yttrium), Group 4 (titanium, zirconium, etc.), Group 5 (vanadium, niobium, etc.), Group 6 (chromium, molybdenum, etc.), Group 7 (manganese, etc.), Group 8 (iron, ruthenium, etc.), Group 9 (cobalt, rhodium, iridium, etc.), Group 10 (nickel, palladium, platinum), Group 11 (copper, silver, gold, etc.), Group 12 (zinc, cadmium, etc.), Group 13 (aluminum, gallium, indium, etc.), Group 14 (germanium, tin, etc.), Group 15 (arsenic, antimony, etc.), and Group 16 (selenium, tellurium, etc.). Among them, Group 12 (zinc), Group 13(aluminum, gallium, indium, etc.), and Group 14 (germanium, tin, etc.) are more preferred, and zinc is even more preferred.

The Group n+1 metals in the periodic table are exemplified by those in Group 4 (titanium, zirconium, etc.), Group 5 (vanadium, niobium, etc.), Group 6 (chromium, molybdenum, etc.), Group 7 (manganese, etc.), Group 8 (iron, ruthenium, etc.), Group 9 (cobalt, rhodium, iridium, etc.), Group 10 (nickel, palladium, platinum), Group 11 (copper, silver, gold, etc.), Group 12 (zinc, cadmium, etc.), Group 13 (aluminum, gallium, indium, etc.), Group 14 (germanium, tin, etc.), Group 15 (arsenic, antimony, etc.), and Group 16 (selenium, tellurium, etc.). Among them, Group 13 metals (n+1=13) are preferred, Group 13 metal (aluminum, gallium, indium, etc.), Group 14 metal (germanium, tin, etc.), and 15 Group metal (arsenic, antimony, etc.) are more preferred, Group 13 metal (aluminum, gallium, indium, etc.) is even more preferred, and aluminum is yet more preferred.

The LDS additive used in this embodiment may contain a trace metal other than the Group n metal and the Group n+1 metal. The trace metal is exemplified by antimony, titanium, indium, iron, cobalt, nickel, cadmium, silver, bismuth, arsenic, manganese, chromium, magnesium, and calcium. These metals may exist in the form of oxide. Content of each of these trace metals is preferably 0.01% by mass or less relative to the LDS additive.

Content of the LDS additive in the resin composition of this embodiment, per 100 parts by mass of the thermoplastic resin, is 5 parts by mass, preferably 10 parts by mass or more, more preferably 20 parts by mass or more, even more preferably 30 parts by mass or more, yet more preferably 50 parts by mass or more, further more preferably 60 parts by mass or more, and may be 70 parts by mass or more, or may be 80 parts by mass or more, depending on applications. At or above the lower limit value, the resin composition will tend to further improve the relative permittivity. The upper limit value of the LDS additive, per 100 parts by mass of the thermoplastic resin, is 150 parts by mass or below, preferably 145 parts by mass or below, more preferably 140 parts by mass or below, even more preferably 130 parts by mass or below, and yet more preferably 125 parts by mass or below. At or below the upper limit value, the molded article will tend to further improve the mechanical strength.

The content of the LDS additive in the resin composition of this embodiment preferably accounts for 20% by mass or more, which is more preferably 25% by mass or more, and even more preferably exceeds 30% by mass. At or above the lower limit value, the resin composition will tend to further improve the relative permittivity. Meanwhile, the content of the LDS additive in the resin composition of this embodiment preferably accounts for 50% by mass or less, which is more preferably 45% by mass or less. At or below the upper limit value, the molded article will tend further improve the mechanical strength.

The resin composition of this embodiment may contain only one kind of, or two or more kinds of the LDS additive. In a case where two or more kinds are contained, the total content preferably falls within the aforementioned ranges.

In the resin composition of this embodiment, mass ratio of the LDS additive and the acid-modified polymer (LDS additive/acid-modified polymer) is preferably 10 or larger, more preferably 14 or larger, and may even be 25 or larger. At or above the lower limit value, the mechanical properties of the thermoplastic resin will tend to be more effectively suppressed from degrading. Meanwhile, the mass ratio of the LDS additive and the acid-modified polymer (LDS additive/acid-modified polymer) is preferably 200 or smaller, more preferably 150 or smaller, even more preferably 100 or smaller, yet more preferably 80 or smaller, and even may be 45 or smaller. At or below the upper limit value, the thermoplastic resin will tend to be more effectively suppress from decomposing.

<Reinforcing Fiber>

The resin composition of this embodiment contains, per 100 parts by mass of the thermoplastic resin, 10 to 150 parts by mass of a reinforcing fiber. With the reinforcing fiber contained therein, the obtainable molded article will have improved mechanical strength.

The reinforcing fiber used in this embodiment preferably demonstrates a relative permittivity, when measured at a frequency of 900 MHz, of smaller than 25. Since the reinforcing fiber having relatively high relative permittivity tends to have elevated loss tangent, so that the reinforcing fiber having relatively low relative permittivity is more preferred. The relative permittivity of the reinforcing fiber is preferably 20 or smaller, more preferably 15 or smaller, even more preferably 10 or smaller, and yet more preferably 8 or smaller. The lower limit value, although ideally zero, may be one or larger, even may be 2 or larger, and yet may be 3 or larger. Glass fiber described later usually has a relative permittivity of 3 to 8.

The reinforcing fiber in this embodiment is not specifically limited, and may be any of a wide variety of fibers used for reinforcing thermoplastic resin.

The reinforcing fiber used in this invention preferably has a number average fiber length (cut length) of 0.5 to 10 mm, which is more preferably 1 to 5 mm. With the inorganic reinforcing fiber having such number average fiber length, the mechanical strength may further be improved. The reinforcing fiber having a number average fiber length (cut length) of 0.5 to 10 mm is exemplified by the one commercialized as chopped strand. The number average fiber length can be determined by randomly selecting the reinforcing fibers whose length will be measured on an image observed under an optical microscope, by measuring the long sides, and by averaging the measured values. Magnification of observation is set to 20×, and the number of fibers to be observed is set to 1,000 or larger. The number average fiber length is approximately equivalent to the cut length.

The reinforcing fiber may have any cross-sectional shape selected from circle, oval, oblong circle, rectangle, rectangle combined with semicircles on both short sides, cocoon and so forth.

The lower limit of the number average fiber diameter of the inorganic reinforcing fiber is preferably 4.0 μm or above, more preferably 4.5 μm or above, and even more preferably 5.0 μm or above. The upper limit of the number average fiber diameter of the reinforcing fiber is preferably 15.0 μm or below, and more preferably 12.0 μm or below. With the reinforcing fiber having the number average fiber diameter controlled within these ranges, obtainable is a molded article that further excels in the platability even after a wet heat process. The molded article can retain excellent platability even after stored or annealed for a long period. Note that the number average fiber diameter of the reinforcing fiber can be determined by randomly selecting the reinforcing fibers whose diameter will be measured on an image observed under an electron microscope, by measuring the diameter at the near center of the fiber, and by averaging the measured values. Magnification of observation is set to 1,000×, and the number of fibers to be observed is set to 1,000 or larger. The number average fiber diameter of glass fiber having a cross-sectional shape other than circle is determined after converting the cross section into a circle having the same area.

Materials for the reinforcing fiber used in this embodiment is not specifically limited, to which a wide variety of organic fiber and inorganic fiber is applicable, wherein the inorganic fiber is preferred.

The reinforcing fiber in this embodiment preferably contains at least one selected from glass fiber and wollastonite, wherein the glass fiber is more preferably contained.

Next, the glass fiber suitably used in this embodiment will be explained.

The glass fiber employable here may be any fiber melt-spun from commonly marketed glasses such as E-glass, C-glass, A-glass, S-glass, D-glass, R-glass, and M-glass, which are not specifically limited so long as they can be spun into glass fiber. In this invention, E-glass is preferably contained.

The glass fiber used in this embodiment is preferably surface-treated with a surface treatment agent which is typically a silane coupling agent such as γ-metacryloxypropyl trimethoxysilane, γ-glycidoxypropyl trimethoxysilane, or γ-aminopropyl triethoxysilane. Amount of adhesion of the surface treatment agent is preferably 0.01 to 1% by mass of the glass fiber. Other glass fibers usable here include those optionally surface-treated with lubricant such as aliphatic amide compound or silicone oil, antistatic agent such as quaternary ammonium salt, film-forming resin such as epoxy resin or urethane resin, and mixture of film-forming resin with additive such as heat stabilizer or flame retardant. The glass fiber used in this embodiment may be sized with a sizing agent. The sizing agent in this case is preferably epoxy-based sizing agent or urethane-based sizing agent.

The glass fiber is commercially available. Commercial products include T-187, T-286H, T-756H and T-289H from Nippon Electric Glass Co., Ltd., DEFT2A from Owens Corning, HP3540 from PPG Industries, and CSG3PA820 from Nitto Boseki Co., Ltd.

Content of the reinforcing fiber (preferably glass fiber) in the resin composition of this embodiment, per 100 parts by mass thereof, is 10 parts by mass or more, preferably 12 parts by mass or more, and more preferably 15 parts by mass or more. At or above the lower limit value, the obtainable molded article will tend to further improve the mechanical strength. Meanwhile, content of the reinforcing fiber (preferably glass fiber) in the resin composition of this embodiment, per 100 parts by mass thereof, is 150 parts by mass or less, preferably 130 parts by mass or less, more preferably 120 parts by mass or less, even more preferably 100 parts by mass or less, yet more preferably 80 parts by mass or less, and furthermore preferably 70 parts by mass or less. At or below the upper limit value, the fluidity during injection molding will tend to improve.

Content of the reinforcing fiber (preferably glass fiber) in the resin composition of this embodiment is preferably 5% by mass or more, more preferably 30% by mass or less, and even more preferably 25% by mass or less.

In the resin composition of this embodiment, difference between the contents of the LDS additive and the reinforcing fiber (preferably glass fiber) (content of LDS additive—content of reinforcing fiber, in % by mass) is preferably 0% by mass or more, more preferably 1% by mass or larger, and even more preferably 5% by mass or larger. The upper limit value is preferably 35% by mass or below. With the content of the LDS additive thus kept larger than the content of the reinforcing fiber (preferably glass fiber), the molded article will more easily be obtainable with high relative permittivity and excellent mechanical strength, while suppressing the loss tangent to a low level.

In the resin composition of this embodiment, mass ratio of the LDS additive and the reinforcing fiber (preferably glass fiber) (content of LDS additive/content of reinforcing fiber) preferably exceeds zero, which is more preferably one or larger, and more preferably exceeds one. At or above the lower limit value, the molded article will further improve the mechanical strength, while further improving the relative permittivity. The mass ratio is preferably 5 or smaller, and more preferably 4 or smaller. At or below the upper limit value, the fluidity during injection molding may further be improved, while further improving the relative permittivity.

The resin composition of this embodiment may contain only one kind of, or two or more kinds of the reinforcing fiber. In a case where two or more kinds are contained, the total content preferably falls within the aforementioned ranges.

<Other Ingredients>

The thermoplastic resin composition of this embodiment may contain other ingredient besides the aforementioned ingredients, without departing from the spirit of this invention. Such other ingredient is exemplified by ceramic filler, stabilizer, antioxidant, mold releasing agent, elastomer, flame retardant, anti-dripping agent, nucleating agent, hydrolysis resistance modifier, matting agent, UV absorber, plasticizer, dispersion aid, antistatic agent, anti-coloring agent, anti-gelling agent and colorant. Details of these compounds may be understood referring to the description in paragraphs [0130] to [0155] of JP-4894982 B1, and in paragraphs [0066] to [0142] of JP-2019-11514 A, the contents of which are incorporated by reference into this patent specification. These ingredients preferably sum up to 20% by mass or less of the thermoplastic resin composition. Only one kind of each of these ingredients may be used, or two or more kinds are used in a combined manner. These ingredients preferably sum up to 20% by mass or less of the resin composition. Only one kind of each of these ingredients may be used, or two or more kinds thereof may be used in combination.

The resin composition of this embodiment is prepared so that the thermoplastic resin, acid-modified polymer, LDS additive, reinforcing fiber, and optionally added other ingredients sum up to 100% by mass. In the resin composition of this embodiment, the total content of the thermoplastic resin, acid-modified polymer, LDS additive and reinforcing fiber preferably accounts for 95% by mass or more of the resin composition, and more preferably accounts for 98% by mass or more.

The resin composition of this embodiment may also contain, or do not necessarily contain, a ceramic filler (excluding the substance that applies to the LDS additive). With the ceramic filler other than the LDS additive mixed therein, the resin composition will become possible to finely control the relative permittivity. Meanwhile, without the ceramic filler other than the LDS additive mixed therein, the molded article will be able to keep the mechanical strength at a higher level.

The ceramic filler used in this embodiment is exemplified by titanium oxide and barium strontium titanate, wherein titanium oxide is preferred.

Content of the ceramic filler, in the resin composition of this embodiment, is preferably 0 parts by mass or more and less than 10 parts by mass, and more preferably 0 parts by mass or more and 5 parts by mass or less.

The resin composition of this embodiment may contain only one kind of, or two or more kinds of the ceramic filler. In a case where two or more kinds are contained, the total content preferably falls within the aforementioned ranges.

<<Stabilizer>>

The thermoplastic resin composition of this invention may contain a stabilizer.

Addition of the stabilizer is advantageous since this can demonstrate effects of improving the heat stability, and of preventing the mechanical strength, transparency, or hue from degrading.

The stabilizer is preferably phosphorus-containing stabilizer, sulfur-containing stabilizer, or phenol-based stabilizer, more preferably phosphorus-containing stabilizer, and even more preferably phosphate compound.

Details of the stabilizer may be understood referring to paragraphs [0070] to [0079] of JP-2020-084037 A, the content of which is incorporated by reference into this patent specification.

Content of the stabilizer in the resin composition of this embodiment, per 100 parts by mass of the thermoplastic resin, is usually 0.001 parts by mass or more, preferably 0.01 parts by mass or more, and more preferably 0.1 parts by mass or more, meanwhile preferably 1 part by mass or less, and more preferably 0.8 parts by mass or less. With the content of the stabilizer controlled within these ranges, an effect of addition of the stabilizer will more effectively be demonstrated.

The resin composition of this embodiment may contain only one kind of, or two or more kinds of the stabilizer. In a case where two or more kinds are contained, the total content preferably falls within the aforementioned ranges.

<<Antioxidant>>

The resin composition of this embodiment may contain an antioxidant.

The antioxidant is preferably phenol-based antioxidant, and more preferably hindered phenol-based antioxidant.

The antioxidant may be understood referring to the antioxidant described in paragraphs [0117] to [0119] of JP-2019-182994 A, the contents of which are incorporated by reference into this patent specification.

Content of the antioxidant in the resin composition of this embodiment, per 100 parts by mass of the thermoplastic resin, is usually 0.001 parts by mass or more, preferably 0.005 parts by mass or more, and more preferably 0.01 parts by mass or more, meanwhile usually 1 part by mass or less, preferably 0.5 parts by mass or less, and more preferably 0.4 parts by mass or less. With the content of the antioxidant controlled within the aforementioned ranges, an effect of addition of the antioxidant will more effectively be demonstrated.

The resin composition of this embodiment may contain only one kind of, or two or more kinds of the antioxidant. In a case where two or more kinds are contained, the total content preferably falls within the aforementioned ranges.

<<Mold Releasing Agent>>

The resin composition of this embodiment may contain a mold releasing agent.

The mold releasing agent is exemplified by aliphatic carboxylic acid, ester formed between aliphatic carboxylic acid and alcohol, aliphatic hydrocarbon compound having a number average molecular weight of 200 to 15,000, and polysiloxane-based silicone oil. Also oxidized polyolefin wax (oxidized polyethylene wax) is exemplified.

Details of the mold releasing agent may be understood referring to ester compounds and so forth described in paragraphs [0094] to [0098] of JP-2019-183017 A, and paragraphs [0029] to [0073] of WO2019/078162, the contents of which are incorporated by reference into this patent specification.

Content of the mold releasing agent in the resin composition of this embodiment is preferably 0.001% by mass or more in the resin composition, and more preferably 0.01% by mass or more, meanwhile preferably 2% by mass or less, more preferably 1% by mass or less, and even more preferably 0.8% by mass or less. With the content of the mold releasing agent controlled to the lower limit value of the range or above, a mold releasing effect will be demonstrated effectively, meanwhile controlled to the upper limit value of the range or below, degradation of the hydrolysis resistance and die pollution during injection molding will be suppressed effectively. Although the obtainable molded article will have high transparency irrespective of the content of the mold releasing agent, the hardness and heat resistance will tend to further improve at or below the upper limit value of the range.

Only one kind of, or two or more kinds of the mold releasing agent may be contained. In a case where two or more kinds are contained, the total content preferably falls within the aforementioned ranges.

<<Elastomer>>

The resin composition of this embodiment may contain an elastomer. With the elastomer contained therein, the obtainable molded article will have improved impact strength. The elastomer used in this embodiment is exemplified by methyl methacrylate-butadiene-styrene copolymer (MBS resin), styrene-butadiene-based triblock copolymer and hydrogenated product thereof respectively called SBS and SEBS, styrene-isoprene-based triblock copolymer and hydrogenated product thereof respectively called SPS and SEPS, olefin-based thermoplastic elastomer called TPO, polyester-based elastomer, siloxane-based rubber, acrylate-based rubber, and epoxy-containing elastomer. Styrene-butadiene-based triblock copolymer and hydrogenated product thereof, styrene-isoprene-based triblock copolymer and hydrogenated product thereof, olefin-based thermoplastic elastomer, polyester-based elastomer, siloxane-based rubber, and acrylate-based rubber are preferred.

The elastomer used here may be elastomers described in paragraphs [0075] to [0088] of JP-2012-251061 A, elastomers described in paragraphs [0101] to [0107] of JP-2012-177047 A, elastomers described in paragraphs [0076] to [0087] of JP-2016-98242 A, and elastomers described in paragraphs [0080] to [0087] of JP-2019-11514 A, contents of which are incorporated by reference into this patent specification.

Content of the elastomer, per 100 parts by mass of the thermoplastic resin, is preferably 1 part by mass or more, and more preferably 2 parts by mass or more, meanwhile, preferably 20 parts by mass or less, more preferably 15 parts by mass or less, and even more preferably 10 parts by mass or less.

The resin composition used in this embodiment may contain only one kind of, or two or more kinds of the elastomer. In a case where two or more kinds are contained, the total content falls within the aforementioned ranges.

<<Flame Retardant>>

The resin composition of this embodiment may contain a flame retardant. With the flame retardant contained therein, the obtainable molded article will be given flame retardancy. The flame retardancy tends to be given effectively, particularly in a case where a conductive oxide that contains aluminum and zinc is used as the LDS additive.

The flame retardant is exemplified by halogen-containing flame retardant, organometallic salt-based flame retardant, phosphorus-containing flame retardant, silicone-based flame retardant, and antimony-containing flame retardant. In a case where polyamide resin and/or polyester resin are used as the thermoplastic resin, halogen-containing flame retardant or phosphorus-containing flame retardant is preferably blended. In another case where polycarbonate resin is used as the thermoplastic resin, phosphorus-containing flame retardant or organometallic salt-based flame retardant is preferred, phosphorus-containing flame retardant is more preferred, and phosphate ester compound is even more preferred.

Also a flame retardant aid may be used in combination.

Details of the flame retardant aid are understood referring to the description in paragraphs [0089] to [0117] of JP-2019-11514 A, the contents of which may be incorporated by reference into this patent specification.

Content of the flame retardant, per 100 parts by mass of the thermoplastic resin, is preferably 0.01 parts by mass to 50 parts by mass, more preferably 1 to 50 parts by mass, even more preferably 5 to 50 parts by mass, yet more preferably 6 to 40 parts by mass, and furthermore preferably 7 to 40 parts by mass.

The resin composition of this embodiment may contain only one kind of, or two or more kinds of flame retardant. In a case where two or more kinds are contained, the total content preferably falls within the aforementioned ranges.

<<Anti-Dripping Agent>>

The resin composition used in this embodiment may contain an anti-dripping agent. The anti-dripping agent is preferably polytetrafluoroethylene (pTFE), which has a fibril-forming property, can easily disperse in the resin composition, and tends to bind the resins to form a fibrous material, thus contributing to improve the flame retardancy. The flame retardancy tends to be given effectively, particularly in a case where a conductive oxide that contains aluminum and zinc is used as the LDS additive.

Polytetrafluoroethylene is specifically exemplified by those marketed under the trade names "Teflon (registered trademark) 6J" and "Teflon (registered trademark) 30J" from Du Pont-Mitsui Fluorochemicals Co., Ltd., under the trade name "Polyflon" from Daikin Industries, Ltd., and under the trade name "Fluon" from AGC Inc.

Content of the anti-dripping agent, per 100 parts by mass of the thermoplastic resin, is preferably 0.01 to 20 parts by mass. With the anti-dripping agent controlled to 0.1 parts by mass or more, the flame retardancy tends to improve, meanwhile with the agent controlled to 20 parts by mass or less, the appearance tends to improve. Content of the anti-dripping agent, per 100 parts by mass of the thermoplastic resin, is more preferably 0.05 to 10 parts by mass, and even more preferably 0.05 to 5 parts by mass.

The resin composition of this embodiment may contain only one kind of, or two or more kinds of the anti-dripping agent. In a case where two or more kinds are contained, the total content preferably falls within the aforementioned ranges.

<Physical Properties of Resin Composition>

Next, physical properties of the resin composition of this embodiment will be explained.

The resin composition of this embodiment preferably has high impact strength. High impact strength can be related to high mechanical strength. More specifically, Charpy unnotched impact strength, when measured with use of an ISO multipurpose test specimen (3 mm thick) at 23° C., in compliance with Standard ISO 179, is preferably 19 $kJ/m^2$ or larger. The upper limit value of the Charpy unnotched impact strength, although not specifically limited, is practically 100 $kJ/m^2$ or below.

The resin composition of this embodiment preferably has a Charpy notched impact strength, when measured with use of an ISO multipurpose test specimen (3 mm thick) at 23° C. in compliance with Standard ISO 179, of 3 $kJ/m^2$ or larger, which is more preferably 5 $kJ/m^2$ or larger. The upper limit value of the Charpy notched impact strength, although not specifically limited, is practically 50 $kJ/m^2$ or smaller.

The resin composition of this embodiment preferably has high deflection temperature under load. More specifically, the deflection temperature under 1.80 MPa load (in ° C.), when measured after formed into a Type A multipurpose test specimen (4 mm thick) in compliance with ISO 75-1 and ISO 75-2, is preferably 100° C. or higher, more preferably 115° C. or higher, and even more preferably 124° C. or higher. At or above the lower limit value, the resin composition will be suitably applicable to an antenna member of electronic equipment used in high temperature environments. Meanwhile, the upper limit value of the deflection temperature under load, although not specifically limited, is practically 160° C. or below.

The resin composition of this embodiment preferably has high relative permittivity, and low loss tangent.

The resin composition of this embodiment, when formed into a molded article, preferably demonstrates a relative permittivity of 4.0 or larger when measured at least one point in a frequency range from 1 to 10 GHz, which is more preferably 4.3 or larger, even more preferably 4.6 or larger, yet more preferably 4.9 or larger, furthermore preferably 5.0 or larger, again furthermore preferably 5.5 or larger, and may even be 6.0 or larger. The upper limit value of the relative permittivity is typically 10.0 or below, preferably 9.0 or below, more preferably 8.5 or below, even more preferably 8.0 or below, yet more preferably 7.5 or below, and furthermore preferably 7.0 or below.

The resin composition of this embodiment, when formed into a molded article, preferably demonstrate a loss tangent of 0.020 or below when measured at least one point in a frequency range from 1 to 10 GHz, which is more preferably 0.015 or below. The lower limit value of the loss tangent is typically 0.001 or above, and preferably 0.005 or above.

The relative permittivity and the loss tangent are preferably satisfied at least one point in the frequency range from 1 to 10 GHz, preferably at least one point selected from 1

GHz, 2.45 GHz, 5.8 GHz, or 10 GHz, and more preferably at all points of 1 GHz, 2.45 GHz, 5.8 GHz, and 10 GHz.

The Charpy impact strength, the deflection temperature under load, the relative permittivity, and the loss tangent are measured according to methods described later in EXAMPLES.

<Method for Preparing Resin Composition>

Method for preparing the resin composition of this embodiment is freely selectable.

An exemplary method is such as mixing the thermoplastic resin, the acid-modified polymer, the LDS additive, the reinforcing fiber, and other ingredients optionally blended, with use of a mixing means such as a V-type blender to prepare a batch blend, melt-kneading the batch blend in a vented extruder, followed by pelletizing. The reinforcing fiber and so forth may be side-fed.

<Molded Article>

The molded article of this embodiment is formed from the resin composition of this embodiment.

Shape of the molded article is suitably selectable without special limitation, depending on applications and purposes of the molded article, and is exemplified by film-like, rod-like, cylindrical, annular, circular, elliptic, polygonal, irregular, hollow, frame-like, box-like, panel-like, and button-like shapes. Among them, those having film-like, frame-like, panel-like, and button-like shapes are preferred. Thickness, for example, of the frame-like and panel-like shapes is approximately 1 mm to 5 mm.

Method for manufacturing the molded article of this embodiment is not specifically limited, and may be freely selectable from known molding methods usually employed for resin compositions. The method is exemplified by injection molding, ultra-high-speed injection molding, injection compression molding, two color molding, hollow molding such as gas-assisted molding, molding using heat insulation dies, molding with use of rapid heating dies, foam molding (including supercritical fluid), insert molding, IMC (in-mold coating) molding, extrusion molding, sheet forming, thermoforming, rotational molding, laminate molding, press molding and blow molding. Also a molding process based on a hot-runner system is employable.

The molded article formed of the resin composition of this embodiment is preferably used as a plated molded article having on the surface thereof a plating layer. The plating layer in the molded article of this embodiment is preferably embodied with antenna performance.

<Method for Manufacturing Plated Molded Article>

Next paragraphs will disclose a method for manufacturing a plated molded article, the method including irradiating laser light on the surface of the molded article formed of the thermoplastic resin composition of this embodiment, and then applying a metal to form a plating layer.

FIG. 1 is a schematic drawing illustrating a step of forming a plating layer on the surface of a molded article 1, by the laser direct structuring technology. The molded article 1, illustrated in FIG. 1 as a flat substrate, is not always necessarily flat, but instead may be partially or entirely be curved. The obtainable plated molded article is not always necessarily a final product, but instead may be any of various components.

A first embodiment of the molded article involves a smooth surface. A prior process of forming the plating layer has involved rasping of the molded article formed of resin, so as to roughen the surface thereof in order to improve adhesiveness with the plating layer. In contrast, this embodiment can form the plating layer even on a smooth surface.

A second embodiment of the molded article involves an area thereof to be plated, which is not uniformly flat, more specifically having projection and/or recess. This embodiment can properly form the plating layer, even on the area to be plated, which is not uniformly flat.

Referring back to FIG. 1, laser light 2 is irradiated on the molded article 1. The laser is suitably selectable, without special limitation, from known laser lights including YAG laser, excimer laser, and electromagnetic radiation, among them YAG laser is preferred. Also wavelength of the laser light is not specifically limited, and preferably ranges from 200 nm to 1,200 nm, and more preferably from 800 nm to 1,200 nm.

Upon irradiated with the laser light, the molded article 1 is activated only in an area 3 irradiated with the laser light. With the irradiated area thus activated, the molded article 1 is then immersed in a plating solution 4. The plating solution 4 is selectable from a wide range of known plating solutions, without special limitation, such as those (particularly electroless plating solutions) containing as the metal ingredient at least type one of copper, nickel, silver, gold or palladium; among them more preferred are those (particularly electroless plating solutions) containing at least type one of copper, nickel, silver or gold; and further preferred is a plating solution (particularly electroless plating solution) containing copper.

Also there is no special limitation on the method for applying the plating solution 4 to the molded article 1. An exemplary method is such as placing the molded article 1 into the plating solution 4. The molded article to which the plating solution has applied will have formed thereon a plating layer 5, only in the area 3 where the laser light has been irradiated.

The method of this embodiment can form the plating layer (circuit pattern) having a pitch of 1 mm or finer, which is even 150 μm or finer (the lower limit is typically 30 μm or above, although not specifically limited). For the purpose of suppressing the thus formed plating layer (circuit pattern) from being corroded or degraded, the electroless plating may further be followed by protection with nickel or gold. Alternatively for the same purpose, electroless plating may be followed by electroplating, thereby forming a necessary thickness of film within a short time.

The method for manufacturing the plated molded article is suitably used as a method for manufacturing a mobile electronic equipment component having an antenna, the method involving the aforementioned method for manufacturing the plated molded article.

The molded article obtainable from the resin composition of this embodiment includes mobile electronics component, enclosure of electronics component, circuit board, insulating interlayer in semiconductor device, antenna component, insulating material for RF coaxial cable; base components for resistor, switch, capacitor, and photosensor; IC socket and connector; mechanism elements including transportation equipment such as automobile, bicycle, motorcycle, truck, railroad vehicle, helicopter, and aircraft; construction machinery such as bulldozer, hydraulic shovel, and crane; ships such as merchant ship, special purpose ship, fishing ship, and warship; agricultural machinery such as tractor, and harvester; and mechanism components for mobile phone, tablet, wearable device, computer, television set, VR goggles, camera, loudspeaker, drone, robot, sensor, medical equipment, and analytical instrument. In particular, the molded article is preferably used for mobile electronics component.

In addition, this embodiment may be understood referring to the descriptions in JP-2011-219620 A, JP-2011-195820 A, JP-2011-178873 A, JP-2011-168705 A, and JP-2011-148267 A, without departing form the spirit of this embodiment.

EXAMPLES

This invention will further be detailed referring to Examples. All materials, amounts of consumption, ratios, process details and procedures described in Examples below may suitably be modified, without departing from the spirit of this invention. Hence, the scope of this invention is by no means limited to specific Examples below.

In a case where any measuring instrument used in EXAMPLES become unavailable typically due to discontinuation, the measurement may be conducted with use of other instrument having equivalent performances.

1. Raw Materials

Raw materials listed in Tables 1-1 and 1-2 below were used.

TABLE 1-1

| Material | Type |
|---|---|
| PC (A1) | 2,2-Bis-(4-hydroxyphenyl)propane-type aromatic polycarbonate resin, "Iupilon S-3000", from Mitsubishi Engineering-Plastics Corporation<br>Mv = 21,000 |
| PC (A2) | 2,2-Bis-(4-hydroxyphenyl)propane-type aromatic polycarbonate resin, "Iupilon E-2000", from Mitsubishi Engineering-Plastics Corporation<br>Mv = 26,000 |
| PC (A3) | 2,2-Bis-(3-methyl-4-hydroxyphenyl)propane-type aromatic polycarbonate resin<br>Mv = 18,000 |
| PBT | Novaduran 5008, from Mitsubishi Engineering-Plastics Corporation specific viscosity = 0.85 dl/g, terminal carboxy group content = 12 eq/ton |
| GF | Glass chopped strand (glass fiber)<br>"T-187", from Nippon Electric Glass Co., Ltd.<br>aspect ratio in product form = 230, aspect ratio after compounded = 5 to 50 |
| AZO | Aluminum-doped zinc oxide, resistivity (product standard) = 100 to 500 Ω · cm<br>"23-K", from Hakusui Tech Co., Ltd. |
| ATO | Antimony-doped tin oxide, conductive oxide, resistivity ≤ $5 \times 10^3$ Ω · cm<br>"Stanostat CP5CW", from Keeling & Walker Ltd. |
| WAX 1 | "Hi-Wax 1105A", from Mitsui Chemicals, Inc., maleic anhydride-modified LDPE wax, acid value = 60 mgKOH/g |
| WAX 2 | "Hi-Wax 2203A", from Mitsui Chemicals, Inc., maleic anhydride-modified LDPE wax, acid value = 30 mgKOH/g |
| WAX 3 | "Hi-Wax 405MP", from Mitsui Chemicals, Inc., extra-low acid value LDPE wax<br>acid value = 1 mgKOH/g |
| WAX 4 | "Hi-Wax 4202E", from Mitsui Chemicals, Inc., high acid value LDPE wax<br>acid value = 17 mgKOH/g |
| WAX 5 | "Admer HE810", from Mitsui Chemicals, Inc., maleic anhydride-modified HDPE wax<br>acid value = 19 mgKOH/g |
| WAX 6 | "Tafmer M NH5040", from Mitsui Chemicals, Inc., maleic anhydride-modified EBR<br>acid value = 20 mgKOH/g |
| WAX 7 | "Hi-Wax 410P", from Mitsui Chemicals, Inc., non-acid value polyethylene wax<br>acid value = 0 mgKOH/g |

TABLE 1-2

| Material | Type |
|---|---|
| AD 1 | "ADK STAB AX-71", from Adeka Corporation |
| AD 2 | "ADK STAB AO-50", from Adeka Corporation |
| AD 3 | "Loxiol VPG861", from Cognis Japan Ltd. |
| AD 4 | Butadiene-based elastomer<br>"Metablen E-875A", from Mitsubishi Chemical Corporation |
| AD 5 | SEBS-based elastomer<br>"TAIPOL 6150", from Taiwan Synthetic Rubber Corporation |
| AD 6 | "ADK STAB AO-60", from ADEKA Corporation |
| AD 7 | Ethylene/butyl acrylate/glycidyl methacrylate copolymer<br>"Lotader AX8700", from Arkema |
| AD 8 | Oxidized polyethylene wax<br>"LICOWAX PED 522", from Clariant AG |
| FR 1 | Phosphate ester-based flame retardant<br>"PX-200", from Daihachi Chemical Industry Co., Ltd. |
| FR 2 | PTFE<br>"Teflon 6-J", from Chemours-Mitsui Fluoroproducts Co., Ltd. |

2. Examples 1 to 9, 12 to 21, Comparative Examples 1 to 6

The individual ingredients listed in Tables 1-1 and 1-2 above (excluding glass fiber) were blended according to ratios summarized in Tables 2, 4, 6, 10, 12, and 14 below (all given in parts by mass), the blend was uniformly mixed in a tumbler mixer for 20 minutes, and then fed by using a twin screw extruder (TEM26SX, from Shibaura Machine Co., Ltd.) at a cylinder temperature of 280° C. and screw, a screw speed of 250 rpm, and a discharge rate of 20 kg/hr, into an extruder through a barrel arranged on the upstream side of the extruder, and then melt-kneaded. The glass fiber was fed through a side feeder into the twin screw extruder. After the melt kneading, the molten resin composition extruded in the form of strands was quenched in a cooling water bath, and then pelletized to produce pellets. The obtained pellets were evaluated as described later.

Examples 10 and 11

The individual ingredients listed in Table 8, excluding glass fiber, were blended according to ratios summarized in Table 8 (all given in parts by mass), the blend was melt-kneaded in a 30-mm-diameter vented twin screw extruder (TEX30α, from The Japan Steel Works Ltd.), while feeding the glass fiber through a side feeder, at a barrel temperature of 270° C., extruded into the form of strands, pelletized with a strand cutter, to obtain pellets. The obtained pellets were evaluated as follows.

<Melt Volume Rate>

The pellets in Examples 1 to 3, 10 to 21 and Comparative Examples 1 to 6 were dried at 120° C. for 4 hours or longer, meanwhile the pellets in Examples 4 to 9 were dried at 100° C. for 4 hours or longer, and melt volume rate (MVR, in $cm^3$/10 min) was measured according to ISO 1133, at the measurement temperature and load summarized in Tables 3, 5, 7, 9, 11, 13, and 15.

A melt indexer from Toyo Seiki Seisaku-sho Ltd. was used as a measuring instrument.

<Tensile Modulus, Fracture Stress, and Fracture Strain>

The pellets in Examples 1 to 3, 10 to 21 and Comparative Examples 1 to 6 were dried at 120° C. for 4 hours or longer, meanwhile the pellets in Examples 4 to 9 were dried at 100° C. for 4 hours or longer, and injection-molded by using an injection molding machine (NEX80) from Nissei Plastic Industrial Co., Ltd., at a cylinder preset temperature of 280° C., a die temperature of 80° C., an injection time of 2 seconds, and a molding cycle of 40 seconds, to obtain ISO multipurpose test specimens (4 mm thick) for Examples 1 to 9, 12 to 21 and Comparative Examples 1 to 6; meanwhile injection-molded at a cylinder temperature 250° C., a die temperature of 80° C., an injection time of 2 seconds, and a molding cycle of 40 seconds, to obtain ISO multipurpose test specimens (4 mm thick) for Examples 10 and 11.

The obtained ISO test specimens (4 mm thick) were subjected to measurement of tensile modulus (in MPa), fracture stress (in MPa) and fracture strain (in %), in compliance with Standards ISO 527-1 and ISO 527-2.

<Flexural Strength and Flexural Modulus>

The Pellets in Examples 1 to 3, 10 to 21 and Comparative Examples 1 to 6 were dried at 120° C. for 4 hours or longer, meanwhile the pellets in Examples 4 to 9 were dried at 100° C. for 4 hours or longer, and injection-molded by using an injection molding machine (EX80) from Nissei Plastic Industrial Co., Ltd., at a cylinder temperature of 280° C., a die temperature of 80° C., and a molding cycle of 50 seconds, to manufacture ISO multipurpose test specimens (4 mm thick) for Examples 1 to 9, 12 to 21 and Comparative Examples 1 to 6; meanwhile injection-molded at a cylinder temperature of 250° C., a die temperature of 80° C., an injection time of 2 seconds, and a molding cycle of 40 seconds, to manufacture ISO multipurpose test specimens (4 mm thick) for Examples 10 and 11.

The obtained ISO multipurpose test specimens were worked at both ends thereof into a shape specified by Standard ISO 178, and subjected to bending test at room temperature (23° C.), to measure flexural modulus (in MPa) and flexural strength (in MPa).

<Charpy Impact Strength>

The pellets in Examples 1 to 3, 10 to 21 and Comparative Examples 1 to 6 were dried at 120° C. for 4 hours or longer, meanwhile the pellets in Examples 4 to 9 were dried at 100° C. for 4 hours or longer, and injection-molded by using an injection molding machine (NEX80) from Nissei Plastic Industrial Co., Ltd., at a cylinder temperature of 280° C., a die temperature of 80° C., and a molding cycle of 50 seconds, to manufacture ISO multipurpose test specimens (3 mm thick) for Examples 1 to 9, 12 to 21 and Comparative Examples 1 to 6; meanwhile at a cylinder temperature of 250° C., a die temperature of 80° C., an injection time of 2 seconds, and a molding cycle 40 of seconds, to manufacture ISO multipurpose test specimens (4 mm thick) for Examples 10 and 11.

The obtained ISO multipurpose test specimens (3 mm thick for Examples 1 to 9, 12 to 21 and Comparative Examples 1 to 6, and 4 mm thick for Examples 10 and 11) were subjected to Charpy impact test (unnotched) at room temperature (23° C.), according to Standard ISO 179.

The obtained ISO multipurpose test specimens (3 mm thick for Examples 1 to 9, 12 to 21 and Comparative Example 1 to 6, and 4 mm thick for Examples 10 and 11) were also worked into a shape specified by Standard ISO 179, and subjected to Charpy impact test (notched) at room temperature (23° C.), according to Standard ISO 179.

Charpy impact strength was given in $kJ/m^2$.

<Deflection Temperature Under Load>

The pellets in Examples 1 to 3, 12 to 21 and Comparative Examples 1 to 6 were dried at 120° C. for 4 hours or longer, meanwhile the pellets in Examples 4 to 9 were dried at 100° C. for 4 hours or longer, and injection-molded by using an injection molding machine (NEX80) from Nissei Plastic Industrial Co., Ltd., at a cylinder temperature of 280° C., a die temperature of 80° C., and a molding cycle of 50 seconds, to manufacture ISO multipurpose test specimens (4 mm thick).

The obtained ISO multipurpose test specimens (4 mm thick) were worked into shapes specified by Standards ISO 75-1 and ISO 75-2, and subjected to measurement of deflection temperature under load (in ° C.) under 1.80 MPa load, according to Standards ISO 75-1 and ISO 75-2.

<Flame Retardancy>

The pellets obtained in Examples 8 and 9 were dried at 100° C. for 4 hours or longer, and combustion test specimens of 1.5 mm thick were manufactured by using an injection molding machine (SE-50, from Sumitomo Heavy Industries, Ltd.), at a cylinder temperature of 280° C., and a die temperature of 80° C.

Flame retardancy was tested with use of five each of test specimens (1.5 mm thick) according to Underwriters Laboratories Subject 94 (UL94) with ratings V-0, V-1, and V-2, where V-0 is the best. NC means No Class (not classified)

<Relative Permittivity, Loss Tangent>

Flat test specimens formed of the resin composition, each having a size of 100 mm×1.5 mm×2 mm, were subjected to perturbation measurement of relative permittivity and loss tangent, at the individual frequencies listed in Tables 3, 5, 7, 9, 11, 13, and 15.

More specifically, the pellets obtained above in Examples 1 to 3, 10 to 21 and Comparative Examples 1 to 6 were dried at 120° C. for 4 hours or longer; meanwhile the pellets in Examples 4 to 9 were dried at 100° C. for 4 hours or longer, and injection-molded by using an injection molding machine (NEX80) from Nissei Plastic Industrial Co., Ltd., at a cylinder temperature of 280° C., a die temperature of 80° C., and a molding cycle of 50 seconds for Examples 1 to 9, 12 to 21 and Comparative Examples 1 to 6; meanwhile at a cylinder temperature 250° C., a die temperature of 80° C., and a molding cycle of 50 seconds for Examples 10 and 11, thereby manufacturing flat test specimens each having a size of 100 mm×100 mm×2 mm.

The obtained flat test specimens were then cut into flat test specimens having a size of 100 mm×1.5 mm×2 mm, and then subjected to perturbation measurement of relative permittivity and loss tangent at the individual frequencies.

A network analyzer from Keysight Technologies Inc., and a hollow resonator from KANTO Electronic Application and Development Inc. were used for the measurement.

<Platability>

In a 10 mm×10 mm area of each ISO multipurpose test specimen (4 mm thick) obtained above was irradiated with laser light with use of VMcl laser irradiation apparatus (YAG laser at 1064 nm, maximum output=15 W) from Trumpf, Inc., at an output (power) of 8 W or 10 W, a frequency of 60 kHz or 80 kHz, and a speed of 2 m/s. The subsequent plating was conducted in an electroless plating bath Copper 100 XB from MacDermid, Inc. at 65° C.

Evaluation was made as follows. Results are summarized in Tables 3, 5, 7, 9, 11, 13 and 15.

A: plated

B: not plated

TABLE 2

| | Example 1 | Example 2 | Example 3 | Comparative Example 1 | Comparative Example 2 | Comparative Example 3 |
|---|---|---|---|---|---|---|
| PC (A1) | 100.0 | 100.0 | 100.0 | 100.0 | 100.0 | 100.0 |
| GF | 46.1 | 52.1 | 59.9 | 45.0 | 50.8 | 58.1 |
| AZO | 69.1 | 91.1 | 119.8 | 67.6 | 88.8 | 116.3 |
| WAX 1 | 2.3 | 2.6 | 3.0 | | | |
| AD 1 | 0.5 | 0.5 | 0.6 | 0.5 | 0.5 | 0.6 |

TABLE 2-continued

| | Example 1 | Example 2 | Example 3 | Comparative Example 1 | Comparative Example 2 | Comparative Example 3 |
|---|---|---|---|---|---|---|
| AD 2 | 0.2 | 0.3 | 0.3 | 0.2 | 0.3 | 0.3 |
| AD 3 | 0.7 | 0.8 | 0.9 | 0.7 | 0.8 | 0.9 |
| AD 4 | 11.5 | 13.0 | 15.0 | 11.3 | 12.7 | 14.5 |

TABLE 3

| Item | Standard | Conditions | Unit | Example 1 | Example 2 | Example 3 | Comparative Example 1 | Comparative Example 2 | Comparative Example 3 |
|---|---|---|---|---|---|---|---|---|---|
| Melt volume rate | | | $cm^3$/10 min | 12.1 | 11.3 | 9.6 | 28.6 | 31.2 | 36.5 |
| | | Measurement temp. | ° C. | 270 | 270 | 270 | 270 | 270 | 270 |
| | | Measurement load | kgf | 5.00 | 5.00 | 5.00 | 5.00 | 5.00 | 5.00 |
| Tensile modulus | ISO 527-1, | | MPa | 8779 | 8802 | 8854 | 8881 | 9004 | 9206 |
| Fracture stress | 527-2 | | MPa | 68.6 | 69.2 | 70.2 | 84.9 | 84.9 | 84.3 |
| Fracture strain | | | % | 2.1 | 2.1 | 2.0 | 1.8 | 1.7 | 1.5 |
| Flexural strength | ISO 178 | — | MPa | 109.9 | 110.4 | 110.8 | 126.7 | 128.6 | 130.2 |
| Flexural modulus | | — | MPa | 8810 | 8858 | 8900 | 9555 | 9605 | 9590 |
| Charpy unnotched impact strength | ISO 179-1 | 23° C. | kJ/$m^2$ | 23.4 | 20.4 | 20.1 | 18.1 | 15.3 | 12.1 |
| Charpy notched impact strength | | 23° C. | kJ/$m^2$ | 6.7 | 6.1 | 5.9 | 5.7 | 5.7 | 3.1 |
| Deflection temperature under load | ISO 75-1, 75-2 | 1.80 MPa | ° C. | 126.5 | 126.8 | 126.8 | 123.1 | 122.9 | 121.3 |
| Permittivity | IEC 62562 | 1 GHz | — | 5.8 | 6.3 | 6.9 | 5.7 | 6.3 | 6.8 |
| | | 2.45 GHZ | — | 5.8 | 6.3 | 6.9 | 5.6 | 6.3 | 6.7 |
| | | 5.8 GHZ | — | 5.7 | 6.4 | 6.8 | 5.6 | 6.3 | 6.7 |
| | | 10 GHz | — | 5.7 | 6.4 | 6.8 | 5.6 | 6.4 | 6.8 |
| Loss tangent | IEC 62562 | 1 GHZ | — | 0.012 | 0.014 | 0.019 | 0.011 | 0.013 | 0.018 |
| | | 2.45 GHZ | — | 0.011 | 0.012 | 0.018 | 0.012 | 0.012 | 0.016 |
| | | 5.8 GHZ | — | 0.011 | 0.012 | 0.018 | 0.011 | 0.011 | 0.017 |
| | | 10 GHz | — | 0.011 | 0.011 | 0.018 | 0.011 | 0.011 | 0.017 |
| Platability | | | | A | A | A | A | A | A |

TABLE 4

| | Example 4 | Example 5 | Example 6 | Example 7 |
|---|---|---|---|---|
| PC (A1) | 27.7 | 27.3 | 27.7 | 27.3 |
| PC (A2) | 31.4 | 31.4 | 31.4 | 31.4 |
| PC (A3) | 40.9 | 41.3 | 40.9 | 41.3 |
| GF | 20.4 | 20.7 | 20.4 | 20.7 |
| AZO | 71.6 | 72.3 | 71.6 | 72.3 |
| WAX 1 | 1.0 | 2.1 | 1.0 | 2.1 |

TABLE 4-continued

| | Example 4 | Example 5 | Example 6 | Example 7 |
|---|---|---|---|---|
| AD 1 | 0.4 | 0.4 | 0.4 | 0.4 |
| AD 2 | 0.2 | 0.2 | 0.2 | 0.2 |
| AD 3 | 0.6 | 0.6 | 0.6 | 0.6 |
| AD 4 | 10.2 | 10.3 | | |
| AD 5 | | | 10.2 | 10.3 |

TABLE 5

| Item | Standard | Conditions | Unit | Example 4 | Example 5 | Example 6 | Example 7 |
|---|---|---|---|---|---|---|---|
| Melt volume rate | | | $cm^3$/10 min | 19.1 | 17.2 | 25.3 | 22.2 |
| | | Measurement temp. | ° C. | 270 | 270 | 270 | 270 |
| | | Measurement load | kgf | 5.00 | 5.00 | 5.00 | 5.00 |
| Tensile modulus | ISO 527-1, 527-2 | | MPa | 5274 | 5111 | 4914 | 4899 |
| Fracture stress | | | MPa | 72.9 | 71.0 | 68.1 | 67.5 |
| Fracture strain | | | % | 2.4 | 2.5 | 2.5 | 2.5 |
| Flexural strength | ISO 178 | — | MPa | 115.4 | 113.1 | 110.0 | 109.4 |
| Flexural modulus | | — | MPa | 5494 | 5222 | 4874 | 4720 |
| Charpy unnotched impact strength | ISO 179-1 | 23° C. | kJ/$m^2$ | 23.4 | 26.4 | 25.6 | 28.3 |
| Charpy notched impact strength | | 23° C. | kJ/$m^2$ | 4.0 | 6.1 | 5.2 | 6.8 |
| Deflection temperature under load | ISO 75-1, 75-2 | 1.80 MPa | ° C. | 118.2 | 118.9 | 118.5 | 118.4 |
| Permittivity | IEC 62562 | 1 GHz | — | 5.3 | 5.3 | 5.2 | 5.3 |
| | | 2.45 GHZ | — | 5.2 | 5.3 | 5.3 | 5.2 |
| | | 5.8 GHZ | — | 5.2 | 5.2 | 5.3 | 5.3 |
| | | 10 GHz | — | 5.3 | 5.3 | 5.3 | 5.3 |
| Loss tangent | IEC 62562 | 1 GHZ | — | 0.008 | 0.009 | 0.008 | 0.008 |
| | | 2.45 GHZ | — | 0.007 | 0.007 | 0.007 | 0.008 |
| | | 5.8 GHZ | — | 0.007 | 0.007 | 0.007 | 0.007 |
| | | 10 GHz | — | 0.007 | 0.008 | 0.007 | 0.008 |
| Platability | | | | A | A | A | A |

TABLE 6

| | Example 8 | Example 9 |
|---|---|---|
| PC (A2) | 44.60 | 44.60 |
| PC (A3) | 55.40 | 55.40 |
| GF | 27.70 | 27.70 |
| AZO | 96.95 | |
| ATO | | 96.95 |
| WAX 1 | 2.77 | 2.77 |
| AD 1 | 0.55 | 0.55 |
| AD 2 | 0.28 | 0.28 |
| AD 3 | 0.83 | 0.83 |
| AD 4 | 13.85 | 13.85 |
| FR 1 | 33.24 | 33.24 |
| FR 2 | 0.83 | 0.83 |

TABLE 7

| Item | Standard | Conditions | Unit | Example 8 | Example 9 |
|---|---|---|---|---|---|
| Melt volume rate | | | $cm^3$/10 min | 36.1 | 27.3 |
| | | Measurement temp. | ° C. | 270 | 270 |
| | | Measurement load | kgf | 5.00 | 5.00 |
| Tensile modulus | ISO 527-1, | | MPa | 4778 | 4911 |
| Fracture stress | 527-2 | | MPa | 69.4 | 71.2 |
| Fracture strain | | | % | 2.4 | 2.6 |
| Flexural strength | ISO 178 | — | MPa | 110.2 | 114.5 |
| Flexural modulus | | — | MPa | 4959 | 5102 |
| Charpy unnotched impact strength | ISO 179-1 | 23° C. | $kJ/m^2$ | 24.1 | 22.3 |
| Charpy notched impact strength | | 23° C. | $kJ/m^2$ | 4.5 | 5.1 |
| Deflection temperature under load | ISO 75-1, 75-2 | 1.80 MPa | ° C. | 86.1 | 86.5 |
| Flame retardancy | UL94 | 1.5 mmt | — | V-1 | NC |
| Permittivity | IEC 62562 | 1 GHz | — | 5.3 | 5. |
| | | 2.45 GHz | — | 5.2 | 5.0 |
| | | 5.8 GHz | — | 5.2 | 5.1 |
| | | 10 GHz | — | 5.3 | 5.1 |
| Loss tangent | IEC 62562 | 1 GHz | — | 0.008 | 0.007 |
| | | 2.45 GHz | — | 0.007 | 0.008 |
| | | 5.8 GHz | — | 0.007 | 0.010 |
| | | 10 GHz | — | 0.007 | 0.012 |
| Platability | | | | A | A |

TABLE 8

| | Example 10 | Example 11 |
|---|---|---|
| PC (A2) | | |
| PC (A3) | | 11.52 |
| PBT | 100.00 | 88.48 |
| GF | 46.08 | 46.08 |
| AZO | 69.12 | 69.12 |
| ATO | | |
| WAX 1 | 2.30 | 2.30 |
| AD 1 | 0.46 | 0.46 |
| AD 2 | | |
| AD 3 | | |
| AD 4 | | |
| AD 5 | | |
| AD 6 | 0.23 | 0.23 |
| AD 7 | 11.52 | 11.52 |
| AD 8 | 0.69 | 0.69 |
| FR 1 | | |
| FR 2 | | |

TABLE 9

| Item | Standard | Conditions | Unit | Example 10 | Example 11 |
|---|---|---|---|---|---|
| Melt volume rate | | | $cm^3$/10 min | 21.7 | 17.5 |
| | | Measurement temp. | ° C. | 250 | 250 |
| | | Measurement load | kgf | 5.00 | 5.00 |
| Tensile modulus | ISO 527-1, | | MPa | 7230 | 7250 |
| Fracture stress | 527-2 | | MPa | 92 | 88.0 |
| Fracture strain | | | % | 3 | 3 |
| Flexural strength | ISO 178 | — | MPa | 137 | 132 |
| Flexural modulus | | — | MPa | 7040 | 7120 |
| Charpy unnotched impact strength | ISO 179-1 | 23° C. | $kJ/m^2$ | 8.3 | 7.5 |
| Charpy notched impact strength | | 23° C. | $kJ/m^2$ | — | — |
| Deflection temperature under load | ISO 75-1, 75-2 | 1.80 Mpa | ° C. | — | — |
| Permittivity | IEC 62562 | 1 GHz | — | 5.8 | 6.2 |
| | | 2.45 GHz | — | 5.8 | 6.1 |
| | | 5.8 GHz | — | 5.8 | 6.0 |
| | | 10 GHz | — | 5.9 | 6.0 |

TABLE 9-continued

| Item | Standard | Conditions | Unit | Example 10 | Example 11 |
|---|---|---|---|---|---|
| Loss tangent | IEC 62562 | 1 GHz | — | 0.021 | 0.021 |
| | | 2.45 GHz | — | 0.017 | 0.017 |
| | | 5.8 GHz | — | 0.015 | 0.014 |
| | | 10 GHz | — | 0.015 | 0.014 |
| Platability | | | | A | A |

TABLE 10

| | Example 12 | Example 13 |
|---|---|---|
| PC (A1) | 100.0 | 100.0 |
| GF | 41.3 | 34.2 |
| AZO | 51.7 | 25.7 |
| WAX 1 | 2.1 | 1.7 |
| AD 1 | 0.4 | 0.3 |
| AD 2 | 0.2 | 0.2 |
| AD 3 | 0.6 | 0.5 |
| AD 4 | 10.3 | 8.6 |

TABLE 11

| Item | Standard | Conditions | Unit | Example 12 | Example 13 |
|---|---|---|---|---|---|
| Melt volume rate | | | $cm^3$/10 min | 11.0 | 13.2 |
| | | Measurement temp. | ° C. | 270 | 270 |
| | | Measurement load | kgf | 5.00 | 5.00 |
| Tensile modulus | ISO 527-1, | | MPa | 7299 | 6548 |
| Fracture stress | 527-2 | | MPa | 68 | 70 |
| Fracture strain | | | % | 2.6 | 3.0 |
| Flexural strength | ISO 178 | — | MPa | 110 | 113 |
| Flexural modulus | | — | MPa | 7364 | 6510 |
| Charpy unnotched impact strength | ISO 179-1 | 23° C. | $kJ/m^2$ | 24 | 29 |
| Charpy notched impact strength | | 23° C. | $kJ/m^2$ | 6.9 | 8.0 |
| Deflection temperature under load | ISO 75-1, 75-2 | 1.80 MPa | ° C. | 133 | 134 |
| Permittivity | IEC 62562 | 1 GHz | — | 4.9 | 3.9 |
| | | 2.45 GHz | — | 4.9 | 3.9 |
| | | 5.8 GHz | — | 4.9 | 3.8 |
| | | 10 GHz | — | 5.0 | 3.8 |
| Loss tangent | IEC 62562 | 1 GHz | — | 0.009 | 0.007 |
| | | 2.45 GHz | — | 0.008 | 0.007 |
| | | 5.8 GHz | — | 0.008 | 0.007 |
| | | 10 GHz | — | 0.009 | 0.007 |
| Platability | | | | A | A |

TABLE 12

| | Example 14 | Example 15 | Comparative Example 4 | Comparative Example 5 |
|---|---|---|---|---|
| PC (A1) | 100.0 | 100.0 | 100.0 | 100.0 |
| GF | 51.4 | 53.5 | 50.9 | 58.1 |
| AZO | 90.0 | 93.6 | 89.1 | 101.7 |
| WAX 1 | 1.3 | 5.3 | 0.25 | 14.5 |
| AD 1 | 0.5 | 0.5 | 0.5 | 0.6 |
| AD 2 | 0.3 | 0.3 | 0.3 | 0.3 |
| AD 3 | 0.8 | 0.8 | 0.8 | 0.9 |
| AD 4 | 12.9 | 13.4 | 12.7 | 14.5 |

TABLE 13

| Item | Standard | Conditions | Unit | Example 14 | Example 15 | Comparative Example 4 | Comparative Example 5 |
|---|---|---|---|---|---|---|---|
| Melt volume rate | | | $cm^3$/10 min | 19.2 | 5.2 | 28.1 | 1.1 |
| | | Measurement temp. | ° C. | 270 | 270 | 270 | 270 |
| | | Measurement load | kgf | 5.00 | 5.00 | 5.00 | 5.00 |
| Tensile modulus | ISO 527-1, | | MPa | 9446 | 7729 | 9661 | 7836 |
| Fracture stress | 527-2 | | MPa | 77 | 53 | 83 | 39 |
| Fracture strain | | | % | 2.1 | 1.7 | 2.1 | 1.1 |
| Flexural strength | ISO 178 | — | MPa | 123 | 88 | 126 | 60 |
| Flexural modulus | | — | MPa | 9285 | 8324 | 9605 | 8538 |
| Charpy unnotched impact strength | ISO 179-1 | 23° C. | $kJ/m^2$ | 22 | 13 | 21 | 8 |
| Charpy notched impact strength | | 23° C. | $kJ/m^2$ | 5.9 | 4.9 | 5.3 | 4.9 |

TABLE 13-continued

| Item | Standard | Conditions | Unit | Example 14 | Example 15 | Comparative Example 4 | Comparative Example 5 |
|---|---|---|---|---|---|---|---|
| Deflection temperature under load | ISO 75-1, 75-2 | 1.80 MPa | ° C. | 125 | 131 | 124 | 129 |
| Permittivity | IEC 62562 | 1 GHz | — | 6.3 | 6.3 | 6.3 | 6.3 |
| | | 2.45 GHZ | — | 6.3 | 6.3 | 6.3 | 6.3 |
| | | 5.8 GHZ | — | 6.4 | 6.4 | 6.4 | 6.4 |
| | | 10 GHz | — | 6.4 | 6.4 | 6.4 | 6.4 |
| Loss tangent | IEC 62562 | 1 GHZ | — | 0.013 | 0.017 | 0.013 | 0.020 |
| | | 2.45 GHZ | — | 0.012 | 0.014 | 0.012 | 0.016 |
| | | 5.8 GHZ | — | 0.012 | 0.014 | 0.011 | 0.016 |
| | | 10 GHz | — | 0.011 | 0.013 | 0.011 | 0.013 |
| Platability | | | | A | A | A | A |

TABLE 14

| | Example 16 | Example 17 | Example 18 | Example 19 | Example 20 | Example 21 | Comparative Example 6 |
|---|---|---|---|---|---|---|---|
| PC (A1) | 100.0 | 100.0 | 100.0 | 100.0 | 100.0 | 100.0 | 100.0 |
| GF | 52.1 | 52.1 | 52.1 | 53.5 | 52.1 | 52.1 | 52.1 |
| AZO | 91.1 | 91.1 | 91.1 | 93.6 | 91.1 | 91.1 | 91.1 |
| WAX 2 | 2.6 | | | | | | |
| WAX 3 | | 2.6 | | | | | |
| WAX 4 | | | 2.6 | 5.3 | | | |
| WAX 5 | | | | | 2.6 | | |
| WAX 6 | | | | | | 2.6 | |
| WAX 7 | | | | | | | 2.6 |
| AD 1 | 0.5 | 0.5 | 0.5 | 0.5 | 0.5 | 0.5 | 0.5 |
| AD 2 | 0.3 | 0.3 | 0.3 | 0.3 | 0.3 | 0.3 | 0.3 |
| AD 3 | 0.8 | 0.8 | 0.8 | 0.8 | 0.8 | 0.8 | 0.8 |
| AD 4 | 13.0 | 13.0 | 13.0 | 13.4 | 13.0 | 13.0 | 13.0 |

TABLE 15

| Item | Standard | Conditions | Unit | Example 16 | Example 17 | Example 18 | Example 19 | Example 20 | Example 21 | Comparative Example 6 |
|---|---|---|---|---|---|---|---|---|---|---|
| Melt volume rate | | | $cm^3$/ 10 min | 12.8 | 23.2 | 11.8 | 6.1 | 18.2 | 15.1 | 25.4 |
| | | Measurement temp. | ° C. | 270 | 270 | 270 | 270 | 270 | 270 | 270 |
| | | Measurement load | kgf | 5.00 | 5.00 | 5.00 | 5.00 | 5.00 | 5.00 | 5.00 |
| Tensile modulus | ISO 527-1, | | MPa | 8587 | 9231 | 8587 | 8158 | 8909 | 8480 | 9446 |
| Fracture stress | 527-2 | | MPa | 67 | 75 | 64 | 45 | 72 | 70 | 78 |
| Fracture strain | | | % | 2.1 | 2.0 | 2.0 | 1.3 | 2.0 | 2.1 | 2.0 |
| Flexural strength | ISO 178 | — | MPa | 110 | 118 | 101 | 71 | 119 | 112 | 121 |
| Flexural modulus | | — | MPa | 8751 | 9285 | 9071 | 8538 | 9178 | 8538 | 9498 |
| Charpy unnotched impact strength | ISO 179-1 | 23° C. | $kJ/m^2$ | 20 | 19 | 16 | 11 | 20 | 20 | 20 |
| Charpy notched impact strength | | 23° C. | $kJ/m^2$ | 6.2 | 5.3 | 4.8 | 3.8 | 5.6 | 5.6 | 5.4 |
| Deflection temperature under load | ISO 75-1, 75-2 | 1.80 MPa | ° C. | 127 | 125 | 127 | 127 | 125 | 125 | 124 |
| Permittivity | IEC 62562 | 1 GHz | — | 6.3 | 6.3 | 6.3 | 6.4 | 6.3 | 6.3 | 6.3 |
| | | 2.45 GHZ | — | 6.3 | 6.3 | 6.4 | 6.5 | 6.4 | 6.3 | 6.3 |
| | | 5.8 GHZ | — | 6.4 | 6.4 | 6.4 | 6.5 | 6.4 | 6.4 | 6.3 |
| | | 10 GHz | — | 6.4 | 6.4 | 6.4 | 6.6 | 6.4 | 6.4 | 6.4 |
| Loss tangent | IEC 62562 | 1 GHZ | — | 0.014 | 0.013 | 0.015 | 0.018 | 0.014 | 0.014 | 0.013 |
| | | 2.45 GHZ | — | 0.013 | 0.012 | 0.013 | 0.015 | 0.013 | 0.013 | 0.012 |
| | | 5.8 GHZ | — | 0.012 | 0.012 | 0.012 | 0.014 | 0.012 | 0.012 | 0.011 |
| | | 10 GHz | — | 0.012 | 0.011 | 0.012 | 0.013 | 0.012 | 0.011 | 0.011 |
| Platability | | | | A | A | A | A | A | A | A |

As is clear from the results, the resin composition of this invention was found to have high relative permittivity and high mechanical strength, while keeping low loss tangent (Examples 1 to 21). In contrast, the cases without the acid-modified polymer contained therein were found to successfully elevate the relative permittivity while keeping low loss tangent, but to lower the mechanical strength (Comparative Examples 1 to 6).

Use of 2,2-bis-(3-methyl-4-hydroxyphenyl)propane-type aromatic polycarbonate resin (a polycarbonate resin that contains the structural unit represented by formula (1)) as a part of the polycarbonate resin, was found to further decrease the loss tangent (Examples 4 to 7).

Use of conductive zinc oxide as the LDS additive was found to further enhance the flame retardancy (Examples 8 and 9).

REFERENCE SIGNS LIST

1 formed article
2 laser
3 laser-irradiated area
4 plating solution
5 plating layer

The invention claimed is:

1. A resin composition comprising:

per 100 parts by mass of a thermoplastic resin, 0.3 to 10 parts by mass of an acid-modified polymer having an acid value of 0.5 mgKOH/g or more and 1 mgKOH/g or less;

91.1 to 150 parts by mass of a laser direct structuring additive; and 10 to 150 parts by mass of a reinforcing fiber, the laser direct structuring additive being a compound being a conductive oxide having a resistivity of $5\times10^3$ Ω·cm or smaller, and containing at least one type selected from a Group n (n represents an integer of 3 to 16) metal in the periodic table and a Group n+1 metal, or, calcium copper titanate.

2. The resin composition of claim 1, wherein the resin composition is free from a maleic anhydride-modified olefin polymer.

3. The resin composition of claim 1, wherein a content of the laser direct structuring additive in the resin composition is greater than 30% by mass.

* * * * *